US006024915A

United States Patent [19]
Kume et al.

[11] Patent Number: 6,024,915
[45] Date of Patent: *Feb. 15, 2000

[54] COATED METAL PARTICLES, A METAL-BASE SINTER AND A PROCESS FOR PRODUCING SAME

[75] Inventors: Shoichi Kume, Aichi; Haruo Yoshida, Ibaraki; Yukiyoshi Yamada, Saitama; Tadashi Fuyuki, Saitama; Satoshi Akiyama, Saitama; Yoshiaki Hamada, Saitama; Eisuke Kuroda, Saitama, all of Japan

[73] Assignees: Agency of Industrial Science & Technology; Nisshin Flour Milling Co., Ltd., both of Tokyo, Japan

[ * ] Notice: This patent is subject to a terminal disclaimer.

[21] Appl. No.: 08/949,901

[22] Filed: Oct. 14, 1997

Related U.S. Application Data

[63] Continuation of application No. 08/288,954, Aug. 11, 1994, abandoned.

[30] Foreign Application Priority Data

Aug. 12, 1993 [JP] Japan .................................. 5-219279
Aug. 12, 1993 [JP] Japan .................................. 5-219281

[51] Int. Cl.$^7$ ................................ B05D 7/00; B22F 3/12

[52] U.S. Cl. ................................ 419/48; 419/64; 419/66; 427/212; 427/213; 427/215; 428/546; 428/570

[58] Field of Search .................................. 427/212, 213, 427/215, 216; 419/23, 35, 38, 39, 48, 49, 64, 68; 428/546, 570

[56] References Cited

U.S. PATENT DOCUMENTS

| | | | |
|---|---|---|---|
| 4,314,525 | 2/1982 | Hsu et al. | |
| 4,328,042 | 5/1982 | Ostertag et al. | 106/308 B |
| 4,940,523 | 7/1990 | Takeshima | 204/192.12 |
| 5,316,222 | 5/1994 | Kanda et al. | 241/5 |

FOREIGN PATENT DOCUMENTS 375302  3/1991  Japan .

OTHER PUBLICATIONS

Jour. of Soc. of Powder Technology, Masuda et al 30 (10) Translation, 1993.
"Dispersion of Five Particles . . . ", presented by Goto et al 22$^{nd}$ Aut. Conf. Tokyo JP, Oct. 1989.
"J. Soc. Powder Tech. of Japan", —Masuda et al. 30 (10), 1993 translation.
"Disperion of Five Particles . . . disperser", K. Goto et al. 22$^{nd}$ Autumn Conf. Tokyo, Oct. 1989.
"Hawley's Condensed Chemical Dictionary", 12$^{th}$ Edition, pp. 528–529, 1082, 1993.
"Hackh's Chemical Dictionary", 4$^{th}$ Edition, p. 273, 1969.

Primary Examiner—Fred J. Parker
Attorney, Agent, or Firm—Schnader Harrison; Segal & Lewis; Gerald J. Weiser

[57] ABSTRACT

A process for producing a metal-base sinter, comprising sintering coated metal particles wherein the particles are prepared for sintering by the steps of: dispersing a powder of metal core particles in a gaseous atmosphere to form a mixture of a gas and particles in a powder of highly dispersed core particles; charging a precursor for the coat forming substance that has been formed via the vapor phase and/or a precursor for the coat forming substance in a vapor-phase state and the mixture of the gas and the powder of highly dispersed core particles that have a predetermined dispersity according to the average diameter of the core particles in a coating start region of a coating space; coating the surfaces of the core particles with the coat forming substance by allowing the precursor to contact and/or impinge against the core particles; shaping and sintering the thus coated metal core particles or a mixture containing them under appropriate sintering conditions. The metal-base sinter of high performance thus produced is uniform, dense, and sintered firmly to provide a fine and highly controlled microstructure.

35 Claims, 14 Drawing Sheets

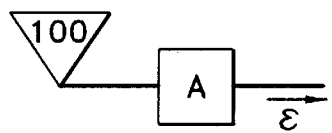
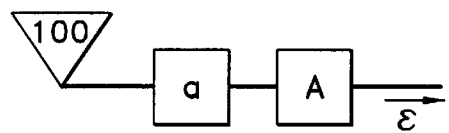
FIG. 3a　　　　　　　　　　FIG. 3b
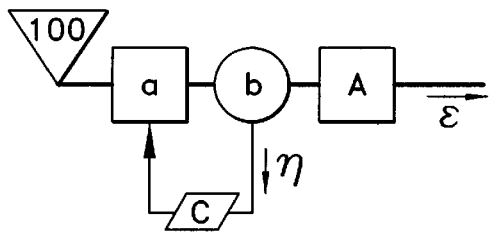
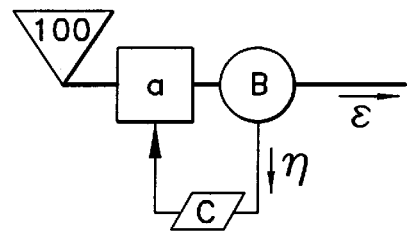
FIG. 3c　　　　　　　　　　FIG. 3d
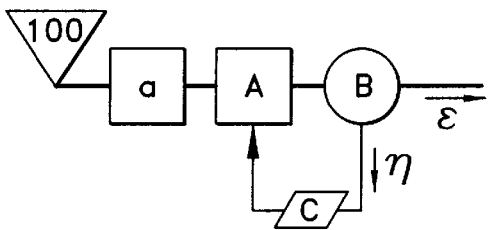
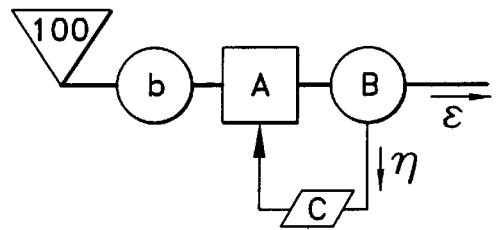
FIG. 3e　　　　　　　　　　FIG. 3f
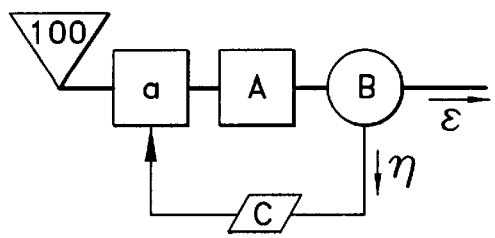
FIG. 3g

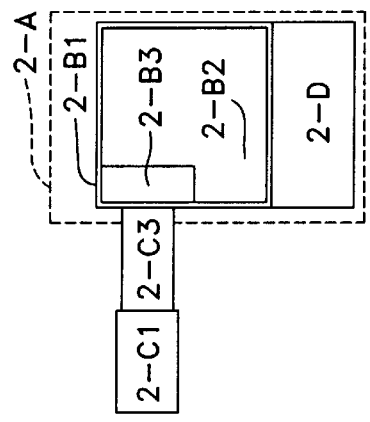
FIG. 5c
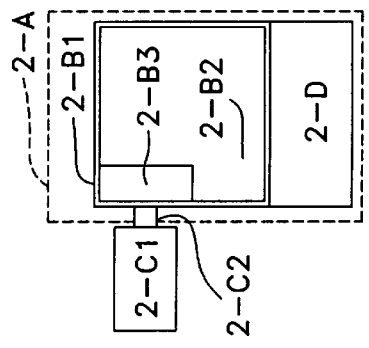
FIG. 5b
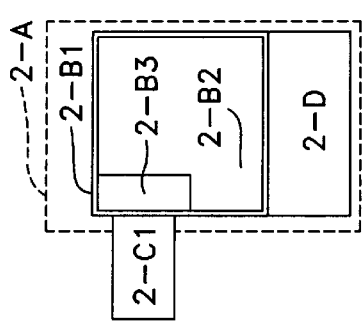
FIG. 5a
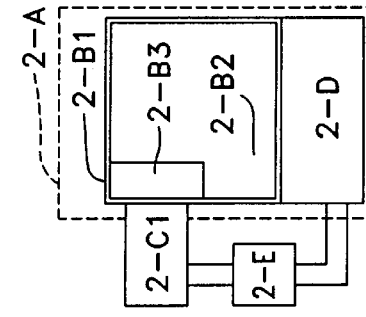
FIG. 5g
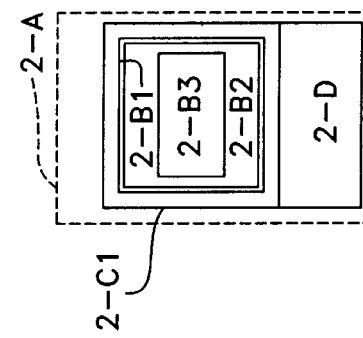
FIG. 5f
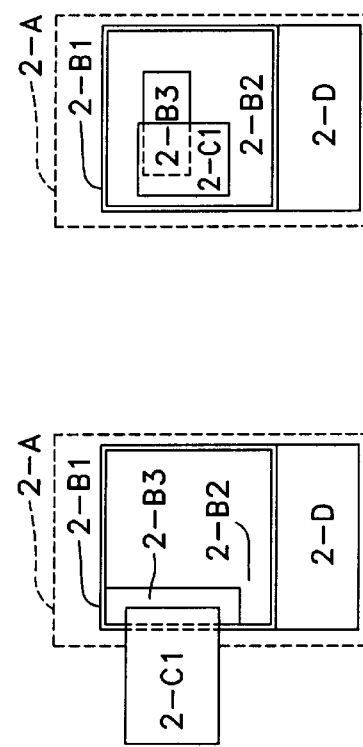
FIG. 5e
FIG. 5d

COATED METAL PARTICLES, A METAL-BASE SINTER AND A PROCESS FOR PRODUCING SAME

This is a continuation of application Ser. No. 08/288,954 filed on Aug. 11, 1994 (now abandoned).

BACKGROUND OF THE INVENTION

This invention relates to coated metal particles having a coat forming substance applied to the surfaces of metal particles. The invention also relates to a process for producing metal-base sinters by sintering those coated metal particles or mixtures containing those particles, as well as metal-base sinters produced by the process.

To enhance the performance of metal-base sinters, providing them with an enhanced composite formulation and structure is insufficient and it is also necessary to refine and homogenize their structure. Energetic R&D efforts have been made to meet this need and as for metals that are fairly stable in atmosphere, particles with diameters no more than 10 $\mu$m are used extensively. As for active metals and those metals under active study in recent years which do not exhibit satisfactory chemical stability when formulated into intermetallic compounds or processed into a powder of fine particles, the commonly used particles exceed 10 $\mu$m in diameter.

In either case, the objective of enhancing the performance of metal-base sinters makes it strongly desirable that the particles be refined or prevented as much as possible from increasing in diameter, that the particles be given a composite structure by dispersive addition of dissimilar substances, and that the composite microstructure be homogenized.

To manufacture such metal-base sinters, the powder metallurgical technology is indispensable. In powder metallurgy, preparing an optimal feed powder for the manufacture of the desired metal-base sinter is important and it is essential that substances that are similar to the substrate and which are capable of enhancing the performance of metal-base sinters and/or substances dissimilar from the substrate and having the same capability, say, those substances which will not react chemically with the metal particles, or the reaction products that form as a result of reaction with the metal particles should be present on the surfaces of those particles so that they are distributed uniformly throughout the interior of the sinter.

A method that permits the addition of such substances at the stage of the preparation of the feed powder is mechanical alloying. This method involves mixing the metal with ceramics, alloys, intermetallic compounds, etc. and kneading the mixture with an attritor, or a powerful ball mill loaded with steel balls. Through the steps of crushing the metal particles during kneading and subsequent adhesion of another kind of particles to the crushed particles, the other particles can be added in such a way that they are dispersed in the metal particles. Mechanical alloying has the added advantage of providing a great latitude in the selection of such parameters as the size and kind of the powder particles and, hence, this technique has heretofore been used by many manufactures.

However, the occurrence of unavoidable incorporation of impurities is more frequent in mechanical alloying than in the usual powder mixing approach; what is more, there is theoretically a limit on the extent to which a uniform structure can be realized. Even if the particles of feed substances such as similar or dissimilar metals, ceramics, intermetallic compounds, etc. which will eventually be incorporated into the desired metal-base material are fine, it is very difficult to insure ideal mixing or uniform dispersion in such a way that the particles of the feed substances will cover all of the metal particles present. Even if such uniform dispersion is realized, the extent of "uniformity" that can be attained on a microscopic level is limited since the particles of the feed substances are mixed on a particle basis. Particularly in the case where those particles are used in relatively small amounts, an uneven distribution will occur inevitably.

In many actual cases, the metal particles in powder form and/or the particles of said feed substances will agglomerate to form lumps in the sinter of the metal-base material or they occur unevenly in the sinter, eventually leading to marked deterioration in the performance of the metal-base sinter.

Therefore, in order to realize homogenization, it is necessary that the feed substances which will eventually be incorporated into the intended metal-base sinter should be distributed positively to all individual metal particles. In addition, the coating on the surfaces of the metal particles must be highly controlled and uniform, namely, coatings of uniform morphology must be provided over the surfaces of individual metal particles and it is further required that such uniform coatings cover every one of the metal particles present. What is more, if the particles have an increased diameter, the highly controlled uniform coating is required to be completely uniform in that they are practically free from uncoated portions.

Thus, it is strongly desired to manufacture coated metal particles that are provided with uniform coats as controlled in accordance with their diameter and to manufacture high-performance metal-base sinters using such coated metal particles.

While feed substances for coatings can be applied by various techniques such as vapor-phase processes and wet plating methods, the vapor-phase approach has major features that are unattainable by other coating techniques, such as (1) easy control of the atmosphere; (2) the selection of coat forming substances which are provided by said feed substances which are eventually incorporated into the intended metal-base sinter is basically unlimited and various kinds of substances including elemental metallic substances (e.g. active metals), nitrides, carbides, borides and oxides can be applied; (3) the desired coat forming substance can be applied without letting impurities be incorporated; and (4) the coating weight of the coat forming substance can be controlled freely.

However, for the reasons to be set forth below, none of the various coating apparatus and methods heretofore proposed as known techniques have been capable of forming uniform coatings controlled in accordance with the diameter of particles.

First, in the case of a core particle powder composed of fine metal particles with diameters of no more than 10 $\mu$m, the individual metal particles are cohesive enough to have a great tendency to agglomerate together, whereby almost all single particles form agglomerates. Since these agglomerates cannot be disintegrated unless they are subjected to a special action greater than their cohesive force, they cannot be simply coated as such to insure that the surfaces of the individual particles are covered with the coatings of said coat forming substances, eventually yielding coated agglomerates in which the surfaces of the agglomerates are covered with the coatings of the coat forming substances. This has caused a problem with the individual agglomerate-forming particles in that the surfaces of the particles located on the surfaces of the agglomerates have large coating weights but suffer from uneven coating whereas the particles located within the agglomerates are not covered at all.

With a core particle powder composed of metal particles exceeding 10 μm in diameter, the cohesive force is not as strong as what develops in fine grains having diameters of no more than 10 μm and, yet it has been impossible to insure that the core metal particles will become discrete to occur on a single-particle basis. Hence, those portions of agglomerates which are blocked by other metal particles remain uncoated on the surfaces. As already mentioned, uniform coatings are needed that are controlled in accordance with the particle diameter and, yet even the small cohesive force discussed above has been so much influential as to cause a very serious problem in actual cases.

With a view to solving these problems, attempts have already been made to coat the metal particles in a dispersed state in order to assure the coating of the surfaces of the individual particles in the powder of core particles.

For instance, Unexamined Published Japanese Patent Application (kokai) Sho 58-31076 teaches an apparatus and method, according to which a vessel placed in PVD equipment is charged with the particles in a powder of core particles and vibrated by an electromagnetic means so that the core particles in the vessel are rolled as they are coated by a PVD process. Unexamined Published Japanese Patent Application (kokai) Sho 61-30663 teaches an apparatus, according to which a vessel placed in PVD equipment is charged with the particles in a powder of core particles and vibrated by a mechanical means so that the core particles in the vessel are rolled as they are coated by a PVD process. However, in the actual practice with those apparatus or methods in which the vessel is vibrated so that the particles in the powder of core particles which are metal particles are rolled as they are provided with coatings, the necessary action for disintegrating the agglomerates of metal particles with an average diameter not greater than 10 μm by applying a force exceeding their cohesive force cannot be produced and, hence, the agglomerates cannot be disintegrated; to the contrary, a granulating action develops to form agglomerates that are greater in number or size than before the powder of core particles is supplied into the vessel. On the other hand, metal particles having an average diameter in excess of 10 μm are simply subjected to a sliding action as they form many layers in superposition and it has been impossible to achieve the desired coating of single separate particles.

Unexamined Published Japanese Patent Application (kokai) Hei 3-153864 teaches an apparatus and method, according to which a rotating vessel having barriers and/or ridges and grooves in the inner surface is charged with core particles and rotated as the surfaces of the particles are coated by an evaporation method. The problem with this apparatus and method is that the necessary action for disintegrating the agglomerates of metal particles with an average diameter not greater than 10 μm by applying a force exceeding their cohesive force cannot be produced and, hence, the agglomerates cannot be disintegrated and, what is more, an increased number or size of agglomerates will simply form. On the other hand, metal particles having an average diameter in excess of 10 μm are simply subjected to a gentle stirring action as many of them contact one another forming many layers in superposition and it has been impossible to achieve the desired coating of single separate particles.

Unexamined Published Japanese Patent Application (kokai) Sho 58-141375 teaches an apparatus in which the particles of a powder in a reactive gas atmosphere are suspended by the flow of the reactive gas under gravity and in which the surfaces of the particles are coated with the precipitating substance that forms by the chemical reaction involving the reactive gas. Unexamined Published Japanese Patent Application (kokai) Hei 2-43377 teaches a method in which particles placed under vacuum are fluidized as they are subjected to coating by a thermochemical reaction treatment. Unexamined Published Japanese Patent Application (kokai) Sho 64-80437 teaches a method in which the agglomerates of core particles in powder are disintegrated by a sound wave that is a composite of low and high frequency waves, so that the agglomerates are fluidized to improve the coating efficiency. However, these techniques which utilize the fluidized bed of the particles in a powder of core particles which is formed by a gas flow or vibrations have had the problem that with metal particles having an average diameter of no more than 10 μm, it is practically impossible to fluidize the separate individual metal particles, thus failing to disintegrate the agglomerates of these metal particles. On the other hand, with metal particles exceeding 10 μm in average diameter, it is practically impossible to insure that all of these metal particles are similarly and independently fluidized and suspended as single separate entities and one has been incapable of eliminating uneven coating of the particles which is due to the hiding of one metal particle by another.

Unexamined Published Japanese Patent Application (kokai) Sho 54-153789 teaches an apparatus in which a powder material is dropped within a vacuum vessel, where the metal vapor is generated to form a metal coating on the particles. Unexamined Published Japanese Patent Application (kokai) Sho 60-47004 teaches a method in which a monomer gas and the particles of a powder are introduced into a high-frequency plasma region in a vacuum vessel, where a coating film of an organic substance is formed by plasma-assisted polymerization. If metal particles with an average diameter of no more than 10 μm are simply introduced as in the techniques described above, agglomerates of the metal particles cannot be disintegrated. On the other hand, metal particles exceeding 10 μm in average diameter will simply drop while forming agglomerates which are not single separate particles and various problems occur, such as uneven coating due to the hiding of one particle by another, the total failure of the particles within an agglomerate to be coated, and differences in the coating weights of individual particles.

Unexamined Published Japanese Patent Application (kokai) Sho 64-80437 teaches a method in which the agglomerates of core particles in powder are disintegrated by a sound wave consisting of low and high frequency waves so that they are fluidized to improve the coating efficiency. However, this method which imparts vibrations to the fluidized bed has had the problem that with metal particles having an average diameter of no more than 10 μm, it is practically impossible to fluidize the separate individual particles, thus failing to disintegrate the agglomerates of these particles. On the other hand, with metal particles exceeding 10 μm in average diameter, it is practically impossible to insure that all of these particles are similarly and independently fluidized and suspended as single separate entities and one has been incapable of eliminating uneven coating of the particles which is due to the hiding of one particle by another.

Unexamined Published Japanese Patent Application (kokai) Sho 62-250172 teaches an apparatus and method, according to which a powder that has been preliminarily treated by jet milling is allowed to stay within a chamber for heat treatment under vacuum, where it is subjected to a heat treatment and thence dropped under gravity through a powder feeder into a cylinderal sputtering chamber equipped with a vertical target, whereby the particles in powder are provided with a coating. Unexamined Published Japanese Patent Application (kokai) Hei 2-153068 teaches an apparatus and method, according to which a powder that has been preliminarily treated by jet milling is allowed to stay within a chamber for heat treatment under vacuum, where it is subjected to a heat treatment and thence introduced through a powder feeder into a rotary vessel accommodating a sputter source within a sputtering chamber in the form of a powder (not as single particles), with sputtering being effected as the vessel is rotated. These techniques involve a heating step which is performed before coating so that the jet-milled powder of core particles of metal particels is allowed to stay for heat treatment and because of this staying of the powder in the heating step, the metal particles of any diameter will form agglomerates again which are not single particles and, eventually, such agglomerates will not revert to single particles in the coating step.

Thus, none of the so far proposed techniques have successfully solved the problems associated with the apparatus or method for providing coatings on the core particles in powder which are metal particles. In actual cases, metal particles having an average diameter of no more than 10 $\mu$m form agglomerates which cannot be disintegrated and, hence, no methods or apparatus have been available for producing coated metal particles in which said metal particles, being dispersed as single particles, are covered on their surfaces with coat forming substances. Speaking of metal particles exceeding 10 $\mu$m in average diameter, these particles are in actual cases subjected to a coating treatment in the form of agglomerates in which they remain in mutual contact and, hence, they have not ever been given highly controlled uniform coatings. In other words, no methods have been available for producing metal particles with highly controlled uniform coatings, nor have been apparatus for implementing such methods. Hence, irrespective of the diameter of starting metal particles, it has been impossible to prepare coated metal particles by providing each of those starting particles with a controlled uniform coat by vapor-phase coating techniques using bonding material forming substances and/or sintering aid forming substances and, it has accordingly been impossible to produce the aforementioned metal-base sinters of high performance.

BRIEF SUMMARY OF THE INVENTION

Under the circumstances, it is strongly desired to provide coated metal particles in which bare metal core particles in powder are coated with coat forming substances on a single-particle basis. Also desired strongly are metal-base sinters of high-performance that use these coated metal particles, as well as a process for producing such metal-base sinters.

An object, therefore, of the invention is to provide coated metal particles in which bare metal core particles in powder are coated with coat forming substances on a single-particle basis.

Another object of the invention is to provide a metal-base sinter of high performance that comprises said coated metal particles and which has a fine and homogeneous structure.

Yet another object of the invention is to provide a process for producing said metal-base sinter.

In order to attain these objects, the present inventors conducted intensive studies and found the following: in order to insure that the particles in a powder of core particles which comprise metal particles are coated, on a single particle basis, with additive substances as coat forming substances for producing the desired metal-base sinters, a mixture of a gas with a powder of highly dispersed core particles in which the particles in said powder of core particles are present in a gaseous atmosphere mainly in a single-particle state must be introduced into the coating start region of a coating space while the particles are in a highly dispersed state such that the dispersity $\beta$ is at least 70%, 80%, 90%, 95%, 97% or 99% depending upon the diameter of the introduced particles and then a coating operation must be started on those particles.

Stated more specifically, the present invention has been accomplished on the basis of the finding of the following two facts: (I) In a mixture of a gas with a powder of highly dispersed core particles in which the particles in said powder of core particles are present in a gaseous atmosphere mainly in a single-particle state, those dispersed particles have a tendency to reagglomerate with the passage of time, chiefly due to turbulent agglomeration, even if they are not allowed to stay within a certain area and once they have formed reagglomerates, it is difficult to disintegrate the latter to a highly dispersed state, namely, to redisperse the agglomerated particles to separate single particles unless they are dispersed by a dispersing means having especially high dispersing performance (the situation is the same as with the agglomerates that formed before the treatment conducted to prepare the highly dispersed core particles) and, to this end, those particles have to be introduced into the coating start region of a coating space while the particles are in a highly dispersed state such that the dispersity $\beta$ is at least 70%, 80%, 90%, 95%, 97% or 99% depending on the diameter of the introduced particles; and to this end, (II) it is necessary to employ one or more dispersing means that have especially high dispersing performance such that the agglomerates composed of the powder of those core particles can be disintegrated and dispersed in a gaseous atmosphere to provide a very high dispersity in accordance with the specific diameter of the particles under treatment.

According to the present invention, there is provided a coated metal particles being prepared by a method comprising the steps of charging a powder of metal core particles into a coating space and then permitting a precursor of a coat forming substance which is generated via the vapor phase and/or a precursor of a coat forming substance in a vapor-phase state to contact and/or impinge against the particles in said powder of core particles so that their surfaces are coated with the coat forming substance;

said coated metal particles being prepared by coating means comprising:
(A) a dispersing step in which the particles in the powder of core particles are dispersed by a group of means for high dispersion treatment of particles in a gaseous atmosphere to form a mixture of a gas and the particles in a powder of highly dispersed particles, the final treating means in said group of means for high dispersion treatment of particles being selected from between:
(a) dispersing means for dispersing the particles in the powder of core particles in a gaseous atmosphere; and
(b) means for selecting a mixture of a gas and the particles in a powder of highly dispersed particles which comprises:
(b-1) means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state; and (b-2) feedback means by which the portion of the powder that is composed of less highly dispersed particles and which has been separated by said means for selecting a mixture of a gas and the particles in a powder of highly dispersed particles is transported to the final dispersing means among the dispersing means in the group of means for high dispersion treatment of particles and/or treating means upstream of the final dispersing means; and (B) a coating step in which the particles in the powder of core particles that have been dispersed in the dispersing step (A) start to be coated by being allowed to contact and/or impinge against the precursor of the coat forming substance in the coating start region of the coating space as they are dispersed to satisfy the following conditions:

the dispersity β should be at least 70% if those particles have an average diameter of no more than 10 μm in the frequency distribution by volume;

the dispersity β should be at least 80% if those particles have an average diameter in excess of 10 μm but no more than 20 μm in the frequency distribution by volume;

the dispersity β should be at least 90% if those particles have an average diameter in excess of 20 μm but no more than 50 μm in the frequency distribution by volume;

the dispersity β should be at least 95% if those particles have an average diameter in excess of 50 μm but no more than 300 μm in the frequency distribution by volume;

the dispersity β should be at least 97% if those particles have an average diameter in excess of 300 μm but no more than 800 μm in the frequency distribution by volume; and the dispersity β should be at least 99% if those particles have an average diameter in excess of 800 μm in the frequency distribution by volume.

Preferably, said coated metal particles are prepared through the following additional step(s):

a step of disagglomeration or otherwise size reduction in which lumps of the coated metal particles that form as a result of association of several particles that contact one another via the coat forming substance on the coated particles are disagglomerated and/or otherwise reduced in size; and/or a step of selective separation in which the associating lumps of the coated metal particles are selectively separated from the coated metal particles on a primary particle basis.

Preferably, the dispersing step is performed by:

a group of means for high dispersion treatment of particles that has such dispersing performance that a powder of core particles having an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a group of means for high dispersion treatment of particles that has such dispersing performance that a powder of core particles having an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a group of means for high dispersion treatment of particles that has such dispersing performance that a powder of core particles having an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a group of means for high dispersion treatment of particles that has such dispersing performance that a powder of core particles having an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a group of means for high dispersion treatment of particles that has such dispersing performance that a powder of core particles having an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a group of means for high dispersion treatment of particles that has such dispersing performance that a powder of core particles having an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%; and said coated metal particles being prepared by:

a method in which the mixture of a gas and the particles in the powder of highly dispersed core particles as formed by one of the means in said group of means for high dispersion treatment of particles is either discharged directly to the coating step or transported thereto via at least one member indispensable to transport that is selected from the group consisting of a hollow member, an intermediate member composed of a member that forms a hollow portion, and a pipe and which is provided between the dispersing and coating steps, as the mixture emerges from a discharge section that discharges said mixture of a gas and the particles; and/or a method in which the mixture of a gas and the particles in the powder of highly dispersed core particles as formed by one of the means in said group of means for high dispersion treatment of particles is transported to the coating step via at least one means selected from the group consisting of means for maintaining the dispersion in a gaseous atmosphere of the highly dispersed core particles in the mixture of a gas with the core particles which have been dispersed in the gaseous atmosphere to attain one of the dispersities set forth above, means for enhancing the dispersion in a gaseous atmosphere of the highly dispersed core particles in the mixture of a gas with the core particles which have been dispersed in the gaseous atmosphere to attain one of the dispersities set forth above, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state.

Preferably, the dispersing step is performed by:

a group of means for high dispersion treatment of particles that has such dispersing performance that a powder of core particles having an average diameter of no more than 10 $\mu$m in the frequency distribution by volume is dispersed in a gaseous atmosphere by the final treatment by said group of means for high dispersion treatment of particles, thereby forming a mixture of a gas and the particles in the powder of highly dispersed core particles and that the dispersity $\beta$ of the particles in said powder of core particles is adjusted to at least 70%;

a group of means for high dispersion treatment of particles that has such dispersing performance that a powder of core particles having an average diameter in excess of 10 $\mu$m but no more than 20 $\mu$m in the frequency distribution by volume is dispersed in a gaseous atmosphere by the final treatment by said group of means for high dispersion treatment of particles, thereby forming a mixture of a gas and the particles in the powder of highly dispersed core particles and that the dispersity P of the particles in said powder of core particles is adjusted to at least 80%;

a group of means for high dispersion treatment of particles that has such dispersing performance that a powder of core particles having an average diameter in excess of 20 $\mu$m but no more than 50 $\mu$m in the frequency distribution by volume is dispersed in a gaseous atmosphere by the final treatment by the group of means for high dispersion treatment of particles, thereby forming a mixture of a gas and the particles in the powder of highly dispersed core particles and that the dispersity $\beta$ of the particles in said powder of core particles is adjusted to at least 90%;

a group of means for high dispersion treatment of particles that has such dispersing performance that a powder of core particles having an average diameter in excess of 50 $\mu$m but no more than 300 $\mu$m in the frequency distribution by volume is dispersed in a gaseous atmosphere by the final treatment by the group of means for high dispersion treatment of particles, thereby forming a mixture of a gas and the particles in the powder of highly dispersed core particles and that the dispersity $\beta$ of the particles in said powder of core particles is adjusted to at least 95%;

a group of means for high dispersion treatment of particles that has such dispersing performance that a powder of core particles having an average diameter in excess of 300 $\mu$m but no more than 800 $\mu$m in the frequency distribution by volume is dispersed in a gaseous atmosphere by the final treatment by the group of means for high dispersion treatment of particles, thereby forming a mixture of a gas and the particles in the powder of highly dispersed core particles and that the dispersity $\beta$ of the particles in said powder of core particles is adjusted to at least 97%; and a group of means for high dispersion treatment of particles that has such dispersing performance that a powder of core particles having an average diameter in excess of 800 $\mu$m in the frequency distribution by volume is dispersed in a gaseous atmosphere by the final treatment by the group of means for high dispersion treatment of particles, thereby forming a mixture of a gas and the particles in the powder of highly dispersed core particles and that the dispersity $\beta$ of the particles in said powder of core particles is adjusted to at least 99%; and said coated metal particles being prepared by performing at least one part of the dispersing step in such a way that it shares one or more parts of the space with at least one part of the coating step.

Preferably, said coated metal particles are prepared with the coating start region of the coating space being located in either one of the following space regions that includes planes through which all particles in the powder of highly dispersed core particles as mixed with a gas will pass:

a space region in which a powder of core particles that have an average diameter of no more than 10 $\mu$m in the frequency distribution by volume is dispersed in a gaseous atmosphere by the final treatment by said group of means for high dispersion treatment of particles, thereby forming a mixture of a gas and the particles in the powder of highly dispersed core particles and that the dispersity $\beta$ of the particles in said powder of core particles is adjusted to at least 70%;

a space region in which a powder of core particles that have an average diameter in excess of 10 $\mu$m but no more than 20 $\mu$m in the frequency distribution by volume is dispersed in a gaseous atmosphere by the final treatment by said group of means for high dispersion treatment of particles, thereby forming a mixture of a gas and the particles in the powder of highly dispersed core particles and that the dispersity $\beta$ of the particles in said powder of core particles is adjusted to at least 80%;

a space region in which a powder of core particles that have an average diameter in excess of 20 $\mu$m but no more than 50 $\mu$m in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%, or wherein said coated metal particles are prepared with the coating start region of the coating space being located in either one of the following space regions that includes planes through which all particles to be recovered into the recovery section of the recovery means will pass:

a space region in which a powder of core particles that have an average diameter of no more than 10 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said group of means for high dispersion treatment of particles, thereby forming a mixture of a gas and the particles in the powder of highly dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the group of means for high dispersion treatment of particles, thereby forming a mixture of a gas and the particles in the powder of highly dispersed core particles and that the dispersity β of the particles in said powder of core particles is adjusted to at least 99%.

Preferably, the particles in the powder of core particles to be used have a size distribution of ($[D_M/5, 5D_M]$, $\geq 90\%$) in terms of frequency distribution by volume, where $D_M$ represents the average particle diameter.

According to another aspect of the present invetion, there is provided a process for producing a metal-base sinter comprising the step of sintering the coated metal particles described above or mixtures containing such particles.

According to still another aspect of the present invetnion, there is provided a metal-base sinter that is produced by the process for producing a metal-base sinter as recited above.

Thus, in accordance with the present invention, metal-base sinters are produced by the following methods: the particles in a powder of core particles that are metal particles and the surfaces of which are coated with a coat forming substance are sintered. In the practice of this invention, the metal particles the surfaces of which are coated with the coat forming substance are prepared by the following method: a precursor for the coat forming substance that has just formed via the vapor phase by a vapor-phase process and/or a precursor for the coat forming substance in a vapor-phase state and a mixture of a gas with a powder of highly dispersed core particles that have been dispersed in a gaseous atmosphere by the final treating means in a group of means for high dispersion treatment of particles are allowed to combine with each other in the coating start region of a coating space while the particles in the mixture of a gas and the powder of highly dispersed core particles are in a dispersed state with their dispersity being adjusted to one of the values set forth in preceding paragraphs depending upon their diameter, whereupon the precursor and the mixture are allowed to contact and/or impinge against each other so that the surfaces of the metal particles are coated with the coat forming substance. By so doing, one can produce a heretofore unattainable metal-base sinter of high performance a microstructure of which is uniform and minute. The precursor for the coat forming substance which is to be used in preparing the coated core particles is in a vapor-phase state as comprised of atoms, molecules, ions, clusters, atomic clusters, molecular clusters, cluster ions, etc. or it has just formed via the vapor phase; having started to contact and/or impinge against the metal particles in the already-discussed highly dispersed state, the coat forming substance binds firmly to the surfaces of the individual core particles in the state of primary particles, thereby yielding coated metal particles in which those core particles form are covered with the coat forming substance on a single particle basis.

BRIEF DESCRIPTION OF THE DRAWINGS

FIGS. 3a–3g are block diagrams showing in greater detail the arrangements of means for high dispersion treatment of particles;

FIGS. 5a–5g are block diagrams showing the compositions of various apparatus for producing coated metal particles;

DETAILED DESCRIPTION OF THE INVENTION

Figure 1A:
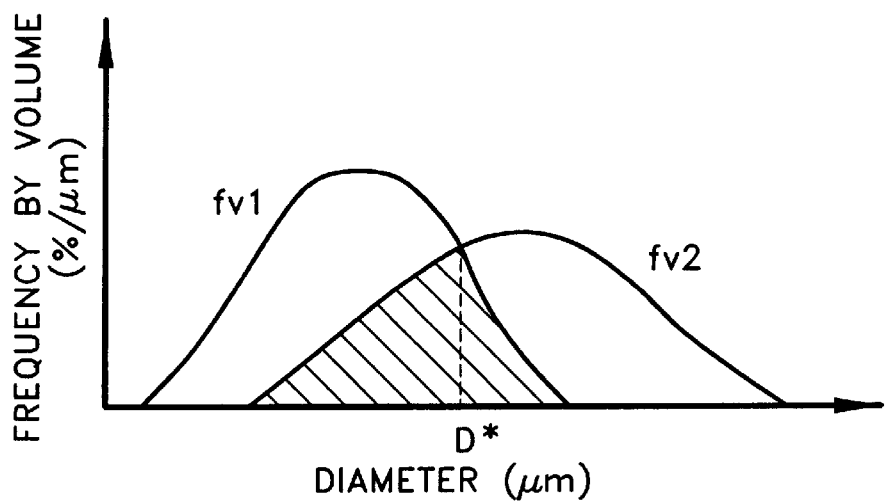
FIG. 1a is a diagram showing the dispersity β of particles in a powder.

The present invention is described below in detail. Before going into details of the invention, let us define the various terms, phrases and expressions that are used herein, and describe, if necessary, the specific implications of those terms, phrases and expressions, and then proceed to the description of the technical means for preparing ceramic particles coated with coat forming substances.

Coated Metal Particles

The term "coated metal particles" refers to the metal particles to be described below which are provided with coats. To give one specific example, the terms refer to those coated particles in which metal core particles are provided with the coats of coat forming substances in the form of at least one type selected from among ultrafine particles, islands, continuous phase, uniform membranes, projections, etc.

Particles in a Feed Powder for Metal Particles

In accordance with the invention, there are provided coated metal particles in which metal core particles in powder form are provided with coatings of one or more coat forming substances on the surfaces. The metal particles to be coated are of a substance that can be selected from the group consisting of elemental metals, metalloids, semiconductor, etc. that will not react and/or alloy with one or more coat forming substances, as well as elemental metals, metalloids, semiconductors, etc. that will react and/or alloy with one or more coat forming substances to generate the intended inorganic compound, alloy, intermetallic compound, etc.

Vapor-Phase Coating Method

The term "vapor-phase coating method" means a method in which coating is applied with the feed of a coat forming substance being passed at least once through a vapor-phase state that consists of at least one member selected from among a molecular stream, an ionic stream, a plasma, a gas, a vapor and an aerosol; alternatively, the term refers to a method in which coating is applied from the feed of a coat forming substance in either one of the vapor-phase states mentioned above.

Core Particles

The term "core particles" refers to those particles which are to be provided with coatings. Such particles may sometimes be referred to as "base particles", "seed particles" or "particles to be coated".

The substances that make up these core particles comprise metals, alloys or intermetallic compounds that are composed of one or more elements selected from among metals, semiconductors, metalloids and rare earth metals which are of groups 1a, 2a, 3a, 4a, 5a, 6a, 7a, 1b, 2b, 3b, 4b, 5b, 6b, 7b, and 8 of the periodic table. Specific examples of such substances include: Al, B, Si, Fe, Ni, Co, Ti, Nb, V, Zr, Hf, Ta, W, Re, Cr, Cu, Mo, Y, La, TiAl, $Ti_3Al$, $TiAl_3$, TiNi, NiAl and $Ni_3Al$.

Powder of Core Particles

The term "powder of core particles" means a powder consisting of core particles. The phrase "the particles in a powder of core particles" refers to those particles which compose the powder of core particles. The particles in the powder of core particles to be coated which are used in the present invention range from fine particles the average diameter of which is not more than 10 μm in terms of frequency distribution by volume to those particles the average diameter of which exceeds 800 μm in terms of frequency distribution by volume.

Preferred particles are those which have such a particle size distribution that the average diameter $D_M$ satisfies the relation ($[D_M/5, 5D_M]$, $\geq 90\%$) in terms of frequency distribution by volume.

With powders having such comparatively narrow distributions, their dispersion or cohesion characteristics are characterized by average particle diameter and the powders can be dispersed by operating a group of means for high dispersion treatment of particles under conditions that suit the specific value of $D_M$.

With a powder of core particles the particle size distribution of which is either broad or has a plurality of separate spaced peaks, a suitable selective separation treatment, say, classification may advantageously be performed and the individual classified powder portions are subjected to the coating treatment according to the invention. By so doing, coating can be started on the individual classified powder portions under the above-stated conditions in the coating start region of the coating space with the dispersity β adjusted to at least 70%, 80%, 90%, 95%, 97% or 99% depending on the average particle diameter, whereupon the individual particles in the powder of core particles can be provided with coatings.

Coat Forming Substance

The term "coat forming substance" means a substance that forms a coat on the particles to be coated. This may specifically be exemplified by those substances which provide the particles in the powder of core particles with coatings in the form of at least one kind selected from among ultrafine particles, islands, continuous phase, uniform membranes, projections, etc.

Particularly in the case where the coat forming substance assumes the form of ultrafine particles, their diameter may range from 0.005 μm to 0.5 μm.

The coat forming substance may form a coating by itself or, alternatively, it reacts with the metals in the core particles and/or dissolves in the metal particles and/or alloys with the metal particles and/or two or more coat forming substances may be reacted and/or alloyed with each other and/or dissolved in each other to form coatings. To this end, the coat forming substance is selected from among elemental substances and/or compounds that generate one or more of the desired inorganic compounds, alloys, intermetallic compounds, etc. to form such coatings, thereby serving as sintering aids and/or bonding materials which promote the sintering of the coated metal particles and/or as surface modifiers for the metal particles.

The coat forming substance is also selectable as a surface modifier which controls the grain boundaries of the metal particles. Various modifications may be performed as required and they include, for example: enhancing the chemical bonding between the metal particles and said sintering aid and/or bonding material; isolating the individual metal particles from a certain substance, thereby inhibiting the reaction between metal particles with a certain substance. These methods contribute to an outstanding increase in the latitude in the selection of the coat forming substance as a sintering aid and/or bonding material, which certainly is a definite advantage for the purposes of the invention.

The coat forming substances for use in metal-base sinters may be inorganic compounds having higher melting points than the above-described metal particles; alternatively, they may be selected from among those coat forming substances which will react with and/or dissolve in said metal particles to generate inorganic compounds as reaction products having higher melting points than the metal particles, or they may be such that two or more coat forming substances are reacted and/or alloyed with each other to yield inorganic compounds having higher melting points than the metal particles.

These coat forming substances can be those which contain at least one member selected from among metals, semiconductors, metalloids, rare earth metals and nonmetals of groups 1a, 2a, 3a, 4a, 5a, 6a, 7a, 1b, 2b, 3b, 4b, 5b, 6b, 7b and 8 of the periodic table, as well as oxides, nitrides, carbides, oxynitrides, oxycarbides, carbonitrides, oxycarbonitrides, borides and silicides thereof, as exemplified by the following: Al, B, Si, Fe, Ni, Co, Ti, Nb, V, Zr, Hf, Ta, W, Re, Cr, Cu, Mo, Y, La, TiAl, $Ti_3Al$, $TiAl_3$, TiNi, NiAl, $Ni_3Al$, SiC, TiC, ZrC, $B_4C$, WC, $W_2C$, HfC, VC, TaC, $Ta_2C$, NbC, $Mo_2C$, $Cr_3C_2$, $Si_3N_4$, TiN, ZrN, $Si_2N_2O$, AlN, HfN, V$x$N (x=1–3), NbN, TaN, $Ta_2N$, TiB, $TiB_2$, $ZrB_2$, VB, $V_3B_2$, $VB_2$, NbB, $NbB_2$, TaB, $TaB_2$, MoB, $MoB_2$, $MoB_4$, $MO_2B$, WB, $W_2B$, $W_2B_5$, $LaB_6$, $B_{13}P_2$, $MoSi_2$, BP, $Al_2O_3$, $ZrO_2$, $MgAl_2O_4$ (spinel) and $Al_2SiO_5$ (mullite).

The amounts in which the coat forming substances are added to form the coats on the surfaces of the coated metal particles are not limited in any particular way and suitable values between a small and large amount can be selected that suit specific uses; advantageously, any desired values are selected as long as they are capable of densifying the metal sinters.

Uniform Coating

In the case where the coat forming substance takes the form of a uniform membrane, the term "uniform coating" means that the coating film is uniform in every portion of a single particle. In the case where the coat forming substance takes the form of an ultrafine particle, an island or a projection, the term "uniform coating" means that the coat forming substance in the form of an ultrafine particle, an island or a projection provides a coating of uniform distribution. It should be understood that any unevenness that is unavoidable in the process of generation of the coat forming substance will be embraced within the category of "uniformity".

Definition of "Charging into the Coating Space"

The phrase "charging into the coating space" means introducing the powder of core particles into the coating space by a certain method of falling such as free fall. In the case of charging by means of a carrier gas, the phrase means introducing the powder of core particles as it is carried in the direction of a mixture of a gas and the particles in the powder of core particles, or carried by a gas in the direction of its flow, or carried by a gas to change the direction of flow. Alternatively, the phrase means introduction under the action of a carrier gas, for example, through the wave motion, specifically, a nonlinear wave motion, of the carrier gas. Alternatively, the phrase means introduction into the coating space by sound waves, ultrasonic waves, magnetic fields, electron beams, etc. in the gas. The phrase also means introduction in an applied field such as an electric field, a magnetic field or electron beams. Specifically, the powder particles may be charged or magnetized in an electric field, a magnetic field, by electron beams, etc. and introduced into the coating space by attractive or repulsive forces. Also contemplated by the phrase is introduction by aspiration under the back pressure of the gas or in vacuo.

Coating Space

The term "coating space" refers to a space in which the precursor of the coat forming substance which is generated from the feed of the coat forming substance via the vapor phase and/or the precursor of the coat forming substance in a vapor-phase state contacts and/or impinges against the particles in the powder of core particles. Alternatively, the term refers to a space region in which the surfaces of the particles in the powder of core particles are coated with the coat forming substance.

Coating Chamber

The term "coating chamber" means a compartment having the coating space in at least one part. More specifically, the coating chamber is a partitioned or generally partitioned (generally closed or semi-closed) compartment including the coating space and it is a compartment including the coating space in at least one part.

Within Gaseous Atmosphere

The expression "within a gaseous atmosphere" means within a space under vacuum or in a vapor-phase state. The term "vapor-phase state" as used herein means various states such as a molecular stream, an ionic stream, a plasma, a gas and a vapor. Technically speaking, the term "vacuum" refers to a state under reduced pressure. Strictly speaking, gases, molecules, atoms, ions, etc. are contained at any values of reduced pressure.

Precursor of the Coat Forming Substance

The term "precursor of the coat forming substance" means a precursor for the coat forming substance. More specifically, it refers to the feed per se of the coat forming substance in a vapor-phase state or, alternatively, it means a substance that is formed and/or synthesized from the feed of the coat forming substance via the vapor phase and which exists until just before it forms a coating on the core particles to be coated. The precursor of the coat forming substance is not limited to any state as long as it is formed and/or synthesized from the feed of the coat forming substance via the vapor phase. If the feed of the coat forming substance is in the vapor phase, the feed itself can be used as the precursor of the coat forming substance. The precursor of the coat forming substance may itself be in the vapor phase. If the precursor of the coat forming substance is a reactive substance, it may be prior to, or during or after the reaction. Specific examples of the precursor of the coat forming substance include ions, atoms, molecules, clusters, atomic clusters, molecular clusters, cluster ions, superfine particles, gases, vapors, aerosols, etc.

Feed of the Coat Forming Substance

The term "feed of the coat forming substance" refers to a feed material that passes through the vapor phase to become a coat forming substance. Specific examples of the state in which the feed of the coat forming substance may exist include solid lumps, powder particles, gases, liquids, etc.

Dispersity β

Dispersity β was proposed by Masuda, Gotoh et al. as an index for evaluating the dispersing performance of powder dispersing equipment [see KAGAKU KOGAKU, Summaries of Speeches and Lectures Delivered at the 22th Autumn Conference, p. 349 (1989)] and is defined as the proportion of the weight of particles in the state of apparent primary particles relative to the total weight of the particles present. The term "particles in the state of apparent primary particles" as used herein refers to the proportion of the overlap between the frequency distribution by mass of powder particles in a given state of dispersion $f_{m2}$ and the frequency distribution by mass of completely dispersed powder particles $f_{m1}$ and is expressed by β according to the following equation:

$$\beta = \int_0^{D_m^*} f_{m2}(D)\,dD + \int_{D_m^*}^{\infty} f_{m1}(D)\,dD$$

where

D: particle diameter ($\mu$m);

$D_m^*$: the particle diameter ($\mu$m) for the point of crossing between $f_{m1}$ and $f_{m2}$;

$f_{m1}$: the frequency distribution by mass (%/$\mu$m) representing the particle size distribution for complete dispersion;

$f_{m2}$: the frequency distribution by mass (%/$\mu$m) representing the particle size distribution of particles in a given state of dispersion; and β: dispersity (%).

In the equation set forth above, the unit of measurement ($\mu$m) of the particle diameter is not limited to any particular value.

This equation evaluates dispersity on the basis of the particle size distribution as expressed by mass; however, dispersity should in principle be evaluated on the basis of the particle size distribution expressed by volume. But given the same density of powder particles, the particle size distribution as expressed by mass is equal to the particle size distribution expressed by volume. Therefore, in practice, the particle size distribution by mass which is easy to measure is determined and used as an equivalent of the particle size distribution by volume. Therefore, the dispersity β in the true sense of the term is expressed by the following equation and the area of the hatched portion shown in FIG. 1a:

$$\beta = \int_0^{D_v^*} f_{v2}(D)\,dD + \int_{D_v^*}^{\infty} f_{v1}(D)\,dD$$

where

D: particle diameter ($\mu$m);

$D_v^*$: the particle diameter ($\mu$m) for the point of crossing between $f_{v1}$ and $f_{v2}$;

$f_{v1}$: the frequency distribution by volume (%/$\mu$m) representing the particle size distribution for complete dispersion;

$f_{v2}$: the frequency distribution by volume (%/$\mu$m) representing the particle size distribution of particles in a given state of dispersion; and β: dispersity (%).

In the equation set forth above, the unit of measurement ($\mu$m) of the particle diameter is not limited to any particular value.

In the following description, the distribution of the particles in the powder of core particles and their average diameter should, in principle, be based on volume unless otherwise noted.

Frequency Distribution by Volume

The frequency distribution by volume represents the distribution of particle diameter in terms of the relative volume of particles in a certain range of diameters.

Definition of ([D1,D2], ≧90%)

Figure 1B:
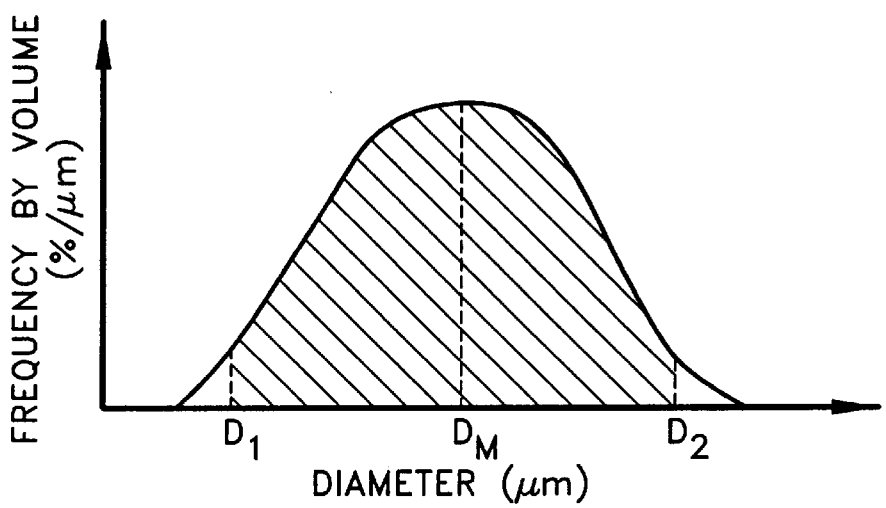
FIG. 1b is a diagram showing the frequency by volume vs diameter relationship of a powder 90% of the volume of which is occupied by particles with sizes in the range from $D_1$–$D_2$.

A ([D1,D2], ≧90%) distribution represents one in which particles from D1 to D2 (D1 and D2 each represent the particle diameter, provided that D1<D2) account for at least 90% of the total volume of the particles present; a powder having this distribution is shown graphically in FIG. 1b, in which the hatched portion accounts for at least 90% of the area under the curve.

Definition of Frequency Distribution by Volume
([$D_M/5, 5D_M$], $\geq 90\%$)

A particle size distribution that is express ed by ([$D_M/5, 5D_M$], $\geq 90\%$) in terms of frequency distribution by volume represents one in which particles ranging in diameter from one fifth of $D_M$ to five times $D_M$ ($D_M$ is the average particle diameter by volume) account for at least 90% of the total volume of the particles present. Consider, for example, particles having an average diameter $D_M$ of 10 μm on a volume basis; a particle size distribution that is expressed by ([$D_M/5, 5D_M$], $\geq 90\%$) in terms of frequency distribution by volume represents one in which particles ranging in diameter from 2 μm to 50 μm account for at least 90% of the total volume of the particles present. The average particle diameter $D_M$ on a volume basis is expressed by:

$$D_M = \frac{\int_0^\infty D f(D) dD}{\int_0^\infty f(D) dD}$$

where f(D) is the frequency distribution by volume. Or $D_M$ is technically expressed by:

$$DM = \Sigma(ViDi)/\Sigma Vi$$

where Vi is the volume of a group of particles within a given interval of diameters Di±ΔDi/2 (ΔDi is the width of interval).

Coating Start Region

The region where coating is first started after the final treatment by the group of means for high dispersion treatment of particles is called the "coating start region". Therefore, prior to the final treatment by the group of means for high dispersion treatment of particles, no region is called the "coating start region" according to this definition even if coating is first started there.

Dispersity β in the Coating Start Region

In the present invention, the coating chamber is provided in such a way that the coating start region of the coating space is located in a region that satisfies one of the following conditions:

A powder of core particles should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 70%, at least 80%, at least 90%, at least 95%, at least 97% or at least 99% in accordance with the average diameter of the particles.

Given one of those dispersities in the coating start region of the coating space, one can disperse and coat the particles in the powder of core particles to such a state that they are substantially single particles in a gaseous atmosphere, so that the precursor of the coat forming substance will uniformly contact and/or impinge against at least one part of the surfaces of all particles in the powder of core particles that pass through the coating start region of the coating space, whereby the coat forming substance can be deposited on single particles in equal amounts.

In the present invention, dispersity β varies continuously with the average diameter of the particles in the powder of core particles but because of the difficulty involved in expressing it, the convenient stepwise expression is adopted.

Advantageously, in the coating start region of the coating space, one of the following conditions is satisfied:

a powder of core particles that have an average diameter of no more than 10 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 80%;

a powder of core particles that have an average diameter in excess of 10 μm but no more than 20 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 90%;

a powder of core particles that have an average diameter in excess of 20 μm but no more than 50 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity of the particles in said powder of core particles should be adjusted to 95%;

a powder of core particles that have an average diameter in excess of 50 μm but no more than 300 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to 97%;

a powder of core particles that have an average diameter in excess of 300 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 99%. Given the dispersity at the coating start region of the coating space in such a way as to satisfy those conditions, the particles in the powder of core particles are at least free from areas that are substantially closed by two adjacent core particles and it is possible to assure that the precursor of the coat forming substance is allowed to contact and/or impinge against the surfaces of individual particles from every direction, whereby coating can be accomplished uniformly.

The particles in a powder of core particles that have an average diameter exceeding 10 μm in the frequency distribution by volume are subjected to a cohesive action in a gaseous atmosphere, although not as intense as in the case of the particles in a powder of core particles that have an average diameter no more than 10 μm in the frequency distribution by volume, and they contact and/or impinge against one another, causing unevenness in the distribution of the particles in the powder of highly dispersed core particles which form a mixture with a gas. However, if the coating of the particles in the powder of core particles is started as they are dispersed to provide one of the above-specified dispersities, the particles in the powder of core particles can be coated with the coat forming substance more uniformly on a single particle basis and, accordingly, the individual particles can be coated with the coat forming substance in more uniform weights.

More advantageously, in the coating start region of the coating space, a powder of core particles that have an average diameter of no more than 10 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 90%, or a powder of core particles that have an average diameter in excess of 10 μm but no more than 20 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 95%, or a powder of core particles that have an average diameter in excess of 20 μm but no more than 50 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 97%, or a powder of core particles that have an average diameter in excess of 50 μm in the frequency distribution by volume should be dispersed in a gaseous atmosphere by the final dispersing treatment by the group of means for high dispersion treatment of particles, thereby forming a mixture of a gas and the particles in the powder of highly dispersed core particles and the dispersity β of the particles in said powder of core particles should be adjusted to at least 99%.

If one of these dispersities is attained in the coating start region of the coating space, the core particles are practically free from agglomeration and practically uniform coating can be performed on all surfaces of the individual particles.

If, in a particular case, high-quality coating is desired at the sacrifice of the efficiency of treatment, the dispersity is preferably at least 95%. In this case, the throughput of the treatment of the particles in the powder of core particles may be reduced to a very small level, namely, the concentration by number of the particles in the powder of core particles in the gaseous atmosphere may be reduced so that the particles in the powder of core particles are dispersed completely, whereby uniform coating can thoroughly be accomplished on the entire surfaces of the individual particles.

Group of Means for High Dispersion Treatment of Particles

The group of means for high dispersion treatment of particles which is to be used in the present invention is such that:

(A) it has at least one dispersing means; and
(B) it has, as the final treating means,
   (a) dispersing means for dispersing the particles in a powder of core particles in a gaseous atmosphere or
   (b) means for selecting a mixture of a gas and the particles in a powder of highly dispersed particles which comprises means for selecting a mixture of a gas and the particles in a powder of highly dispersed particles that separates a portion of the powder that is composed of less highly dispersed particles from the mixture of a gas and the particles in the powder of core particles in which the particles in the powder of core particles are dispersed in a gaseous atmosphere, thereby selecting a mixture of a gas and the particles in a powder of highly dispersed core particles in which the particles in the powder of core particles are present in the gaseous atmosphere mainly in a single-particle state and feedback means by which the portion of the powder that is composed of less highly dispersed particles and which has been separated by the means for selecting a mixture of a gas and the particles in a powder of highly dispersed particles is transported to the final dispersing means among the dispersing means in the group of means for high dispersion treatment of particles and/or treating means upstream of the final dispersing means.

Advantageously, the group of means for high dispersion treatment of particles has such dispersing performance that one of the following conditions is satisfied:

(1) a powder of core particles that have an average diameter of no more than 10 μm in the frequency distribution by volume should be dispersed in a gaseous atmosphere by the final treatment by said group of means for high dispersion treatment of particles, thereby forming a mixture of a gas and the particles in the powder of highly dispersed core particles and the dispersity β of the particles in said powder of core particles should be adjusted to at least 70%;

(2) a powder of core particles that have an average diameter in excess of 10 μm but no more than 20 μm in the frequency distribution by volume should be dispersed in a gaseous atmosphere by the final treatment by said group of means for high dispersion treatment of particles, thereby forming a mixture of a gas and the particles in the powder of highly dispersed core particles and the dispersity β of the particles in said powder of core particles should be adjusted to at least 80%;

(3) a powder of core particles that have an average diameter in excess of 20 μm but no more than 50 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 90%;

(4) a powder of core particles that have an average diameter in excess of 50 μm but no more than 300 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 95%;

(5) a powder of core particles that have an average diameter in excess of 300 μm but no more than 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 97%; and (6) a powder of core particles that have an average diameter in excess of 800 μm in the frequency distribution by volume should be dispersed in a gaseous atmosphere by the final treatment by the group of means for high dispersion treatment of particles, thereby forming a mixture of a gas and the particles in the powder of highly dispersed core particles and the dispersity β of the particles in said powder of core particles should be adjusted to at least 99%.

By insuring that the group of means for high dispersion treatment of particles have dispersing capabilities comparable to or better than the various dispersities to be attained in the above-described coating start region and by providing them in correspondence to those dispersities, high-quality coating can be applied in the coating start region to comply with the respective dispersities.

Final Treating Means

If the final treating means in the group of means for high dispersion treatment of particles is a dispersing means, said dispersing means is referred to as the final treatment means in the group of means for high dispersion treatment of particles. If the final treating means in the group of means for high dispersion treatment of particles is a means for selecting a mixture of a gas and the particles in a powder of highly dispersed particles which is equiped with a feedback means by which the portion that has been separated selectively on account of less highly dispersed state during the step of treatment for selecting the mixture of a gas and the particles in the powder of highly dispersed core particles is to be transported to the final dispersing means at the last stage of the means for high dispersion treatment of particles, or if said final treating means is a means for selecting a mixture of a gas and the particles in a powder of highly dispersed particles which is equipped with a feedback means by which the portion that has been separated selectively on account of less highly dispersed state during the step of treatment for selecting the mixture of a gas and the particles in the powder of highly dispersed core particles is to be transported to a treating means upstream of the final dispersing means, said means for selecting a mixture of a gas and the particles in a powder of highly dispersed core particles is referred to as the final treating means in the group of means for high dispersion treatment of particles.

It should be noted here that any means for selecting a mixture of a gas and the particles in a powder of highly dispersed particles that is provided upstream of the means for selecting a mixture of a gas and the particles in a powder of highly dispersed particles that is equipped with a feedback means and which is the final treating means in the group of means for high dispersion treatment of particles ("upstream" may typically mean between the means for selecting a mixture of a gas and the particles in a powder of highly dispersed particles that is equipped with a feedback means and the final dispersing means, or upstream of the final dispersing means) is a constituent element of the group of means for high dispersion treatment of particles and this is true irrespective of whether the feedback means is used or not.

Dispersing Means

The means used to disperse particles is named a dispersing means. Any mechanism that has even a small or slight dispersing effect is usable as a dispersing means and it is used as a dispersing means in the invention. Consider, for example, a rotary feeder and an injection feeder for pneumatic conveying which are commonly used as supply means ["Funtai Kogaku Binran (A Handbook of Particle Technology)", Ed. by Funtai Kogakukai (Society of Particle Technology), published by Nikkan Kogyo Shinbunsha in 1986, pp. 568 and 571]. These apparatus also have a dispersing effect and, hence, they are dispersing means if used as means to achieve dispersion. The dispersion maintaining and promoting means which are to be discussed later are also dispersing means if they are used to achieve dispersion (for increasing $\beta$). Such dispersing means may be a single apparatus or machine or it may be a complex of apparatus and machines; to cover all of these cases, the dispersing means is collectively referred to as the "group of means for high dispersion treatment of particles".

The group of means for high dispersion treatment of particles is such that it operates on at least one selected mechanism of dispersion, such as dispersing the particles in a powder of core particles by a gas stream which accelerates and/or places them in a velocity gradient, dispersing the particles in a powder of core particles by impingement against a static obstacle and/or an obstacle composed of a rotating body, and dispersing the particles in a powder of core particles by mechanical disagglomeration which consists of a fluidized bed and/or pulsation and/or a rotary drum and/or vibrations and/or scraping.

Specifically, the group of means for high dispersion treatment of particles is equipped with at least one selected dispersing means, such as an ejector-type disperser, a Venturi-type disperser, a disperser using a capillary, an agitator, and an obstacle in a gas stream, a disperser using a jet blow, a disperser using a spiral tube and rotating blades, a disperser using rotating pins (Kady mill), a fluidized bed-type disperser, a disperser using pulsation, a disperser using a rotary drum, a disperser using vibrations, a disperser using a vibrating screen and the scraping action of a scraper, an SAEI Gonnel-type disperser, a Chujo-type disperser, a Roller-type disperser, an office-type disperser, a B.M. type disperser, a Timbrell-type disperser, and a Wright-type disperser ["Funtai Kogaku Binran (A Handbook of Particle Technology)", Ed. by Funtai Kogakukai (Society of Particle Technology), published by Nikkan Kogyo Shinbunsha in 1986, p. 430].

Also usable are the dispersers described in official gazettes and exemplified blow: the disperser using agitating blades which is described in Unexamined Published Japanese Patent Application (kokai) Sho 56-1336; the disperser using a high-speed gas stream and dispersing nozzles which is described in Unexamined Published Japanese Patent Application (kokai) Sho 58-163454; the disperser using the dispersing action of rotating blades and the dispersing action of plasma ions which is described in Unexamined Published Japanese Patent Application (kokai) Sho 59-199027; the disperser using the dispersing action of plasma ions which is described in Unexamined Published Japanese Patent Application (kokai) Sho 59-207319; the disperser using an ejector and the dispersing action of plasma ions which is described in Unexamined Published Japanese Patent Application (kokai) Sho 59-216616; the disperser using an ejector and the dispersing action of ion streams which is described in Unexamined Published Japanese Patent Application (kokai) Sho 59-225728; the disperser using the dispersing action of plasma ions which is described in Unexamined Published Japanese Patent Application (kokai) Sho 59-183845; the disperser using the dispersing action of dispersing blades and a pressure gas which is described in Unexamined Published Japanese Patent Application (kokai) Sho 63-166421; the disperser using lineal or annular slit jet ports which is described in Unexamined Published Japanese Patent Application (kokai) Sho 62-176527; the disperser using mesh blades which is described in Unexamined Published Japanese Patent Application (kokai) Sho 63-221829; the disperser using the dispersing action of high-speed gas streams issuing from jet nozzles which is described in Unexamined Published Japanese Patent Application (kokai) Sho 63-1629; the disperser using many small holes which is described in Unexamined Published Utility Model Application (kokai) Sho 63-9218; the ejector-type disperser which is described in Unexamined Published Japanese Utility Model Application (kokai) Sho 62-156854; and the disperser using small holes and orifices which is described in Unexamined Published Japanese Utility Model Application (kokai) Sho 63-6034.

Dispersing means advantageous for use in the group of means for high dispersion treatment of particles include the apparatus that are described in Japanese Patent Application Sho 63-311358, Japanese Patent Application Hei 1-71071, Japanese Patent Application Hei 2-218537, etc.

Means for Selecting a Mixture of a Gas and the Particles in a Powder of Highly Dispersed Core Particles The means for selecting a mixture of a gas and the particles in a powder of highly dispersed core particles is a means that separates a mixture of a gas and the particles in a powder of less highly dispersed core particles from the mixture of a gas and the particles in the powder of core particles so as to select a mixture of a gas and the particles in a powder of highly dispersed core particles that is chiefly composed of those particles which are in a single-particle state. Agglomerating particles, which are aggregates of primary particles, have a greater apparent diameter than the primary particles and, hence, they can be separated by a suitable means such as dry classifying means. An example of the means for selecting a mixture of a gas and the particles in a powder of highly dispersed core particles is at least one dry classifying means selected from among the following: classifying means using gravity, classifying means using inertia force, classifying means using centrifugal force, classifying means using static electricity, classifying means using a fluidized bed, etc.

Specific examples of the means for selecting the mixture of a gas and the particles in a powder of highly dispersed core particles include: a gravity classifier, an inertia classifier, a centrifugal classifier, a cyclone, an air separator, a micron separator, a microplex, a multiplex, a zigzag classifier, an acu-cut, a conical separator, a turbo classifier, a super separator, a dispersion separator, an elbow jet, a fluidized bed classifier, a virtual impactor, an O-Sepa, a sieve, a vibrating screen, a sifter ["Funtai Kogaku Binran (A Handbook of Particle Technology)", Ed. by Funtai Kogaku-kai (Society of Particle Technology), published by Nikkan Kogyo Shinbunsha in 1986, p. 514].

Mixture of a Gas and the Particles in a Powder of Core Particles

The mixture of a gas and the particles in a powder of core particles refers to (a) a homogeneous flow characterized in that the particles in a powder of core particles are suspended uniformly in a gaseous atmosphere (which may be called a "uniform suspension flow"), (b) a heterogeneous flow characterized in that the particles in a powder of core particles show a nonuniform distribution in certain regions of a gaseous atmosphere (which may be called an "inhomogeneous suspension flow"), (c) a flow involving a sliding layer of the particles in a powder of core particles (which may be called a "sliding flow"), or (d) a flow involving a stationary layer of the particles in a powder of core particles.

Mixture of a Gas and the Particles in a Powder of Less Highly Dispersed Core Particles The mixture of a gas and the particles in a powder of less highly dispersed core particles refers to that portion of a mixture of a gas and the particles in a powder of core particles in which the powder particles are present in a gaseous atmosphere mainly in states other than the single-particle state.

Mixture of a Gas and the Particles in a Powder of Highly Dispersed Core Particles The mixture of a gas and the particles in a powder of highly dispersed particles refers to a mixture of a gas and the particles in a powder of core particles in which the powder particles are present in a gaseous atmosphere mainly in a single-particle state. No matter how much high the degree of dispersion is, the mixture of a gas and the particles in a powder of highly dispersed core particles contains agglomerating particles in practice. The mixture of a gas and the particles in a powder of less highly dispersed particles contains non-agglomerating single particles in practice and can be selectively separated into a mixture of a gas and the particles in a powder of less highly dispersed particles and a mixture of a gas and the particles in a powder of highly dispersed particles. The mixture of a gas and the particles in a powder of less highly dispersed particles is converted to a mixture of a gas and the particles in a powder of highly dispersed particles by selective separation and/or redispersion of the agglomerating particles.

Recovery Means

The recovery means is a means for picking up the coated metal particles that have been prepared in the coating space. The part of the recovery means in which the recovery treatment is performed is called the "recovery section". The coated metal particles the coating on which has been provided by passage through the coating start region of the coating space are recovered by direct pickup from the gaseous atmosphere or after temporary storage following pickup from the gaseous atmosphere or together with a gas.

Usable as the recovery section of the recovery means is one of the following members: the recovery section of the recovery means that uses barriers (obstacles), the recovery section of the recovery means that uses gravity, the recovery section of the recovery means that uses inertia forces, the recovery section of the recovery means that uses centrifugal forces, the recovery section of the recovery means that uses coulombic attractive forces; the recovery section of the recovery means that uses thermophoretic forces, the recovery section of the recovery means that uses Brownian diffusion, the recovery section of the recovery means that uses the pulling force of the back pressure, evacuation, etc.

Advantageous examples of the recovery section of the recovery means include a gravity dust collector, an inertia dust collector, a centrifugal dust collector, a filtration dust collector, an electrostatic precipitator, a scrubbing dust collector, a particle packed layer, a cyclone, a bag filter, a ceramic filter, a scrubber, etc.

In the next place, the group of means for high dispersion treatment of particles which is adopted to prepare the coated metal particles is described below with reference to accompanying drawings.

Figure 2A:
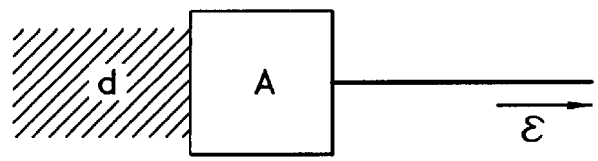
FIGS. 2a, 2b and 2c are block diagrams showing three basic arrangements of means for high dispersion treatment of particles.

Description of the Drawings of the Group of Means for High Dispersion Treatment of Particles FIG. 2a is a block diagram showing an example of the basic composition of the group of means for high dispersion treatment of particles as it is used to prepare coated metal particles. The group is composed of a final dispersing means A for dispersing the particles in a powder of core particles and a constituent element d of the group of means for dispersion treatment which is upstream of the final dispersing means. Shown by $\epsilon$ is a mixture of a gas and the particles in a powder of highly dispersed core particles which are part of the particles in the powder of core particles and which are present in a gaseous atmosphere mainly in a single-particle state. Constituent element d may be any treating means such as dispersing means, supply means, and means for selecting a mixture of a gas and the particles in a powder of highly dispersed core particles, which may be used either individually or in combination. Constituent element d is optional and may be omitted. The group of means for high dispersion treatment of particles is advantageously of such a design that after treatment by the dispersing means A that is the final treating means, one of the following values of dispersity $\beta$ can be realized: (1) at least 70% for a powder of core particles that have an average diameter of no more than 10 $\mu$m in the frequency distribution by volume; (2) at least 80% for a powder of core particles that have an average diameter in excess of 10 $\mu$m but no more than 20 $\mu$m in the frequency distribution by volume; (3) at least 90% for a powder of core particles that have an average diameter in excess of 20 $\mu$m but no more than 50 Am in the frequency distribution by volume; (4) at least 95% for a powder of core particles that have an average diameter in excess of 50 $\mu$m but no more than 300 Am in the frequency distribution by volume; (5) at least 97% for a powder of core particles that have an average diameter in excess of 300 $\mu$m but no more than 800 $\mu$m in the frequency distribution by volume; and (6) at least 99% for a powder of core particles that have an average diameter in excess of 800 $\mu$m in the frequency distribution by volume.

Figure 2B:
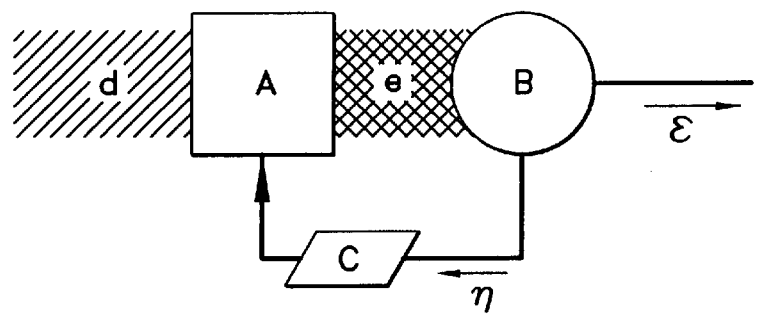

FIG. 2b is a block diagram showing a second example of the basic composition of the group of means for high dispersion treatment of particles as it is used to prepare coated metal particles. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles $\eta$ as separated from a mixture of a gas and the particles in a powder of highly dispersed core particles in which the powder particles are present in a gaseous atmosphere mainly in a single-particle state is fed back to the final dispersing means A, a constituent element d of the group of means for dispersion treatment which is upstream of the final dispersing means, and a constituent element e of the group of means for high dispersion treatment of particles which is provided between the final dispersing means and the final selecting means. As for the mixture $\epsilon$ and the constituent element d, the explanation made in connection with FIG. 2a will apply and, hence, no detailed description is made. Constituent element e may be any treating means other than the dispersing means, such as supply means and selecting means, which may be used either individually or in combination. Constituent elements d and e are optional and may be omitted. The group of means for high dispersion treatment of particles is advantageously of such a design that after treatment by selecting means B which is the final treating means, the above-mentioned values of dispersity can be realized for powders of core particles having the above-mentioned average diameters.

Figure 2C:
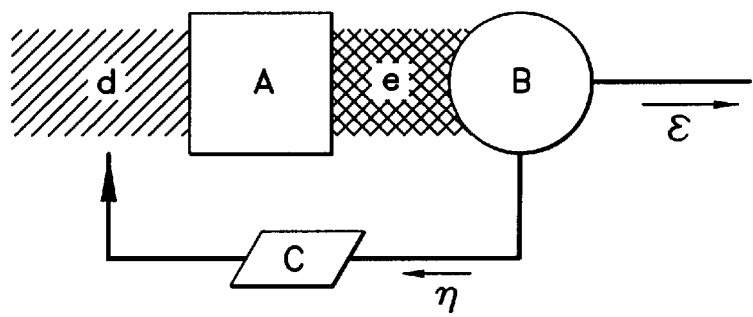

FIG. 2c is a block diagram showing a third example of the basic composition of the group for high dispersion treatment of particles as it is used to prepare coated metal particles. The group is composed of a final dispersing means A for dispersing the particles in a powder of core particles, final means B for selecting a mixture of a gas and the particles in a powder of highly dispersed core particles at the last stage which is equipped with feedback means C by which a mixture of a gas and the particles in a powder of less highly dispersed core particles $\eta$ as separated from a mixture of a gas and the particles in a powder of highly dispersed core particles in which the powder particles are present in a gaseous atmosphere mainly in a single-particle state is fed back to a treating means upstream of the final dispersing means A, a constituent element d of the group of means for high dispersion treatment of particles which is upstream of the final dispersing means, and a constituent element e of the group of means for high dispersion treatment of particles which is provided between the final dispersing means and the final selecting means. As for the mixture $\epsilon$, constituent elements d and e, and the group of means for high dispersion treatment of particles, the foregoing explanation will apply and no detailed description is made.

Having the construction described above, the group of means for high dispersion treatment of particles under discussion may include powder supply sources such as a supply vessel and core particle generating means. To take the case of FIG. 2c as an example, the group of means for high dispersion treatment of particles may of course adopt such a composition that the mixture $\eta$ is fed back to a supply vessel by the feedback means C. It also goes without saying that the step of dispersion by the group of means for high dispersion treatment of particles may be preceded by a disintegrating step in which the particles in the powder of core particles are disintegrated and/or otherwise reduced in size.

Typical specific examples of these basic compositions of the group of means for high dispersion treatment of particles are described below in greater detail with reference to more detailed block diagrams.

Design 1

FIG. 3a is a block diagram illustrating a first specific design of the group of means for high dispersion treatment of particles as it is used to prepare coated metal particles and the drawing corresponds to FIG. 2a. The group shown in FIG. 3a is composed of a supply vessel 100 for supplying the powder of core particles to be coated, and the final dispersing means A for dispersing the powder of core particles to be coated.

Design 2

FIG. 3b is a block diagram illustrating a second specific design of the group of means for high dispersion treatment of particles as it is used to prepare coated metal particles and the drawing corresponds to FIG. 2a. The group shown in FIG. 3b is composed of a supply vessel 100 for supplying the powder of core particles to be coated, dispersing means a for dispersing the powder of core particles to be coated, and the final dispersing means A for dispersing the powder of core particles to be coated.

Design 3

FIG. 3c is a block diagram illustrating a third specific design of the group of means for high dispersion treatment of particles as it is used to prepare coated metal particles and the drawing corresponds to FIG. 2a. The group shown in FIG. 3c is composed of a supply vessel 100 for supplying the powder of core particles to be coated, dispersing means a for dispersing the powder of core particles to be coated, feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back from the mixture of a gas and the particles in the powder of core particles (which have been dispersed by the dispersing means a) to the dispersing means a, means b for selecting the mixture of a gas and the particles in a powder of highly dispersed particles, by which the mixture of a gas and the particles in a powder chiefly composed of highly dispersed core particles is introduced into the final dispersing means A, and the final dispersing means A for dispersing the powder of core particles to be coated.

Design 4

FIG. 3d is a block diagram illustrating a fourth specific design of the group of means for high dispersion treatment of particles as it is used to prepare coated metal particles and the drawing in FIG. 3d corresponds to FIG. 2b. The group shown in FIG. 3d is composed of a supply vessel 100 for supplying the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed core particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 5

FIG. 3e is a block diagram illustrating a fifth specific design of the group of means for high dispersion treatment of particles as it is used to prepare coated metal particles and the drawing corresponds to FIG. 2b. The group shown in FIG. 3e is composed of a supply vessel 100 for supplying the powder of core particles to be coated, dispersing means a for dispersing the powder of core particles to be coated, a final dispersing means A for dispersing the powder of core particles to be coated, feedback means C by which a mixture of a gas and the particles in a powder of less highly dispersed core particles η as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 6

FIG. 3f is a block diagram illustrating a sixth specific design of the group of means for high dispersion treatment of particles as it is used to prepare coated metal particles and the drawing corresponds to FIG. 2b. The group shown in FIG. 3f is composed of a supply vessel 100 for supplying the powder of core particles to be coated, means b for selecting a mixture of a gas and the particles in a powder of highly dispersed core particles, which rejects a mixture of a gas and the particles in a powder chiefly composed of less highly dispersed core particles from the mixture of a gas and the particles in the powder of core particles and which introduces into dispersing means A the mixture of a gas and the particles in a powder chiefly composed of highly dispersed core particles, final dispersing means A for dispersing the particles in the selectively separated powder of core particles, feedback means O by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture of a gas and the particles in the powder of highly dispersed core particles at the final stage and which discharges the mixture of a gas and the particles in the powder of highly dispersed core particles.

Design 7

FIG. 3g is a block diagram illustrating a seventh specific design of the group of means for high dispersion treatment of particles as it is used to prepare coated metal particles and the drawing corresponds to FIG. 2c. The group shown in FIG. 3g is composed of a supply vessel 100 for supplying the powder of core particles to be coated, dispersing means a for dispersing the powder of core particles to be coated, a final dispersing means A for dispersing the powder of core particles to be coated, feedback means C by which a mixture of a gas and the particles in a powder of less highly dispersed core particles as separated from a mixture of a gas and the particles in a powder of highly dispersed particles in which the powder particles are present in a gaseous atmosphere mainly in a single-particle state is fed back from the mixture of a gas and the particles in the powder of core particles (which have been dispersed by the final dispersing means A) to the dispersing means A, and final means B for selecting the mixture or a gas and the particles in the powder of highly dispersed core particles at the final stage and which discharges the mixture of a gas and the particles in the powder of highly dispersed core particles.

Figure 4A:
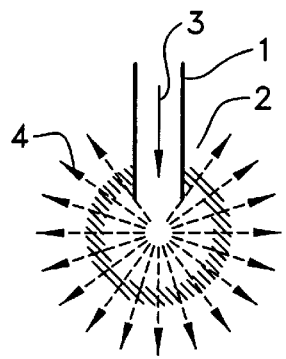
FIGS. 4a–4e are diagrams showing how the coating operation is started on core particles in powder.
Figure 4B:
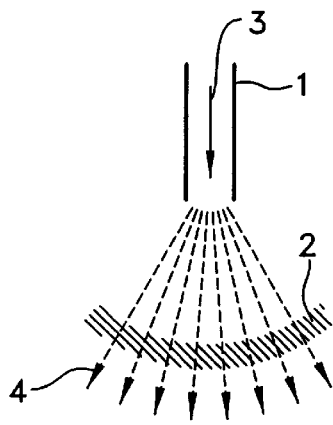
Figure 4C:
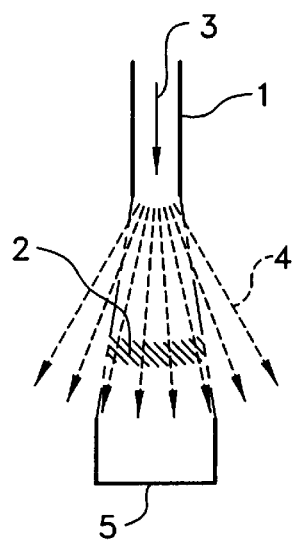

To maintain the thus achieved high dispersive state of the particles, means for maintaining dispersion in a gaseous atmosphere may be added between the group of means for high dispersion treatment of particles and the coating chamber. The term "means for maintaining dispersion in a gaseous atmosphere" as used herein refers to means that maintains a desired value of dispersity β by preventing reagglomeration of the particles in the powder of core particles that have been carried dispersively in a gaseous atmosphere. To promote the thus achieved high dispersive state of the core particles, means for promoting dispersion in a gaseous atmosphere may be added between the group of means for high dispersion treatment of particles and the coating chamber. The term "means for promoting dispersion in a gaseous atmosphere" as used herein refers to means which is primarily intended to promote the redispersion of that part of the particles in the powder of core particles carried dispersively in a gaseous atmosphere which have agglomerated again, thereby retarding the drop in the dispersive state of the powder; the term also refers to means that promotes redispersion in such a way that the state of dispersion that has dropped once can be restored to the initial high dispersive state.

Advantageous examples of said means for maintaining dispersion in a gaseous atmosphere or promoting dispersion in a gaseous atmosphere include a pipe vibrator, a pipe heater, a plasma generator, an electric charger, etc.

The pipe vibrator is means in which a pipe equipped with an oscillator is vibrated to provide the particles dispersed in a gaseous atmosphere with vibrations uncomparable to those imparted by dispersers, whereby reagglomeration is suppressed to maintain the high dispersive state or the dispersion of reagglomerating particles is promoted.

The pipe heater is means in which a heated pipe imparts heat to a carrier gas from outside, thereby expanding the carrier gas so that its flow velocity is accelerated to a level that is too fast to be comparable to that achieved by dispersers, whereby reagglomeration of the particles is suppressed while promoting the dispersion of reagglomerating particles.

The plasma generator is means in which a plasma is generated in the gaseous atmosphere which dispersively caries the powder of core particles, with the resulting plasma ions being allowed to impinge against the core particles, whereby reagglomeration is suppressed to maintain the high dispersive state or the dispersion of reagglomerating particles is promoted.

The electric charger is means in which corona discharge, electron beams, radiations or some other method is used to generate monopolar ions in the gaseous atmosphere which dispersively carries the powder of core particles, which are subsequently passed through the monopolar ion atmosphere to be charged to a single polarity, whereupon electrostatic repulsive forces either suppress reagglomeration to maintain the high dispersive state or promote the dispersion of reagglomerating particles.

The powder of core particles which have been rendered to assume a highly dispersive state in the manner described on the foregoing pages is sent to the coating chamber so that the surfaces of the particles are coated with the coat forming substance. The coating compartment is provided with the coating space including the coating start region.

The group of means for high dispersion treatment of particles is desirably coupled directly to the coating chamber. If necessary, they may be connected together by means of a hollow member and/or a pipe that are indispensable to transport. In this case, too, it is essential that the dispersity β in the coating start region be adjusted to one of the values within the ranges set forth hereinabove.

If the group of means for high dispersion treatment of particles is coupled to the coating chamber located separately, the powder of core particles suffices to be introduced into the coating chamber as it maintains the state of dispersion that has been achieved by said group of means for high dispersion treatment of particles. To this end, means for maintaining dispersion in a gaseous atmosphere (which is a device for maintaining the state of dispersion of the powder of core particles) and/or means for promoting dispersion in a gaseous atmosphere (which is a device for enhancing the state of dispersion) and/or means for selecting a mixture of a gas and the particles in a powder of highly dispersed particles (which separates the powder portion of less highly dispersed core particles from the mixture of a gas and the particles in the powder of core particles, thereby selecting a mixture of a gas and the particles in a powder of highly dispersed core particles, the major part of which comprises particles in a single-particle state) may be provided between the group of means for high dispersion treatment of particles and the coating chamber.

The invention also contemplates that when used to prepare coated metal particles, the group of means for high dispersion treatment of particles may share one or more portions of the space with (1) the coating chamber, (2) the coating space or (3) the coating start region.

For example, the group of means for high dispersion treatment of particles may share its dispersing space with the coating chamber, or with the coating space having the coating start region, or with the coating start region.

The term "coating start region" as used herein refers to the region where the precursor of the coat forming substance that has been generated via the vapor phase and/or the precursor of the coat forming substance in a vapor-phase state contacts and/or impinges against the powder of highly dispersed core particles which has been transported in the state of dispersion that has one of the above-listed values of dispersity β, in accordance with an average diameter of core particles. Five typical embodiments of the coating start region are shown schematically in FIGS. 4*a*–4*e*.

In FIGS. 4*a*–4*e*, the coating start region is indicated by numeral 2.

In the case shown in FIG. 4*a*, the coating start region 2 of the coating space in which the coating of core particles is started as they are dispersed to one of the above-listed values of dispersity in accordance with the average diameter of those core particles is provided in such a way that it surrounds the group of means for high dispersion treatment of particles or its discharge section 1.

In the case shown in FIG. 4*b*, the coating start region 2 of said coating space is provided in such a way that it is passed by all the particles 4 in the powder of core particles as they are discharged from the group of means for high dispersion treatment or its discharge section 1.

By adopting these arrangements, the particles in all powders of core particles can start to be coated as they are dispersed to the above-listed values of dispersity β.

In the case shown in FIG. 4c, the coating start region 2 of said coating space is provided in such a way that it is passed in all cases by those particles 4 in the powder of core particles which are discharged from the group of means for high dispersion treatment of particles or its discharge section 1 to enter the recovery section 5.

Figure 4D:
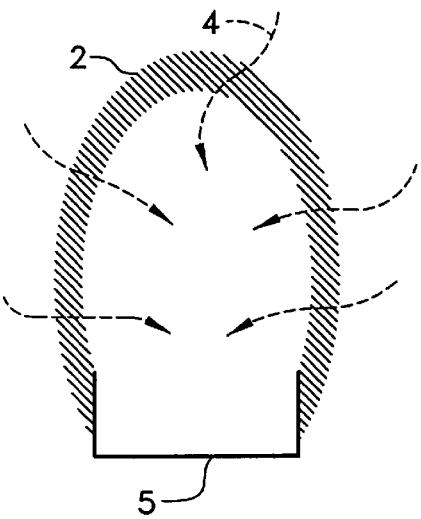

In the case shown in FIG. 4d, the coating start region 2 of said coating space is provided in such a way that it surrounds the recovery section 5.

Figure 4E:
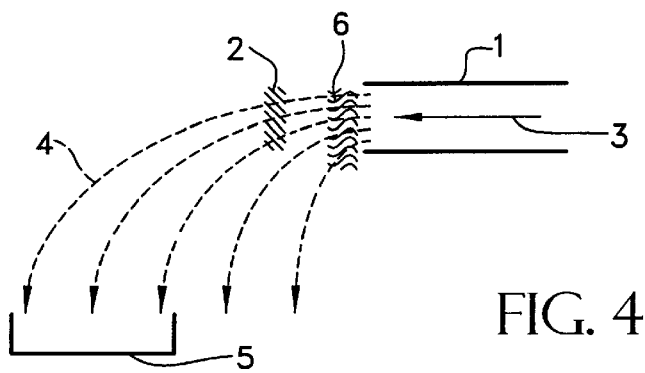

In the case shown in FIG. 4e, the recovery section 5 is provided in a position that can be reached solely by the particles in the mixture of a gas and the particles in the powder of highly dispersed core particles. Hence, the region indicated by 6 in FIG. 4e is selection means using gravity. The coating start region 2 of said coating space is provided in the hatched area of FIG. 4e so that it is passed in all cases by those particles in the mixture of a gas and the particles in the powder of highly dispersed core particles which enter the recovery section. This arrangement insures that only the core particles that started to be coated as they were dispersed to the above-listed values of dispersity β can be recovered and there is no chance that the core particles that did not pass through the coating start region will intermingle with the coated particles which emerge from the coating start region.

As one can understand from the foregoing description, the apparatus for producing coated metal particles are composed of the group of means for high dispersion treatment of particles and the coating chamber or, alternatively, the group of means for high dispersion treatment of particles, the coating chamber and the recovery means. The constituent elements of the apparatus can be combined in various manners and several designs of these apparatus are described below with reference to drawings.

Apparatus Design 1

FIG. 5a is a block diagram showing the construction of a first apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 is coupled directly to the coating chamber 2-B1.

Apparatus Design 2

FIG. 5b is a block diagram showing the construction of a second apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, indispensable hollow member 2-C2, and recovery means 2-D. The group of means for high dispersion treatment of particles 2-C1 is connected to the coating chamber 2-B1 via the indispensable hollow member 2-C2.

Apparatus Design 3

FIG. 5c is a block diagram showing the construction of a third apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, means for maintaining dispersion in gaseous atmosphere 2-C3, and recovery means 2-D. The group of means for high dispersion treatment of particles 2-C1 is connected to the coating chamber 2-B1 via the means for maintaining dispersion in gaseous atmosphere 2-C3.

Apparatus Design 4

FIG. 5d is a block diagram showing the construction of a fourth apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 shares space with the coating chamber 2-B1.

Apparatus Design 5

FIG. 5e is a block diagram showing the construction of a fifth apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The group of means for high dispersion treatment of particles 2-C1 is provided within the coating chamber 2-B1.

Apparatus Design 6

FIG. 5f is a block diagram showing the construction of a sixth apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, and recovery means 2-D. The coating chamber 2-B1 is provided within the dispersing space of the group of means for high dispersion treatment of particles 2-C1.

Apparatus Design 7

FIG. 5g is a block diagram showing the construction of a seventh apparatus for producing coated metal particles. As shown, the apparatus is composed of the main body of the production equipment 2-A (coating apparatus), coating chamber 2-B1, coating space 2-B2, coating start region 2-B3, the group of means for high dispersion treatment of particles 2-C1, recovery means 2-D, and recoating supply means 2-E. The coated particles issuing from the recovery means 2-D can be transported by the recoating supply means 2-E to the group of means for high dispersion treatment of particles 2-C1 for performing repeated coating treatments.

Either one of the apparatuses of these designs can produce coated metal particles.

The coated metal particles in which the powder of core particles (metal particles) has its surface coated with the coat forming substance may be coated again with the coat forming substance or subjected to repeated recoating operations. In these cases, the coated metal particles are sent to the recoating supply means. The term "recoating supply means" as used herein refers to means for transporting the coated metal particles to the group of means for high dispersion treatment of particles to perform recoating. Specifically, the recoating supply means is furnished with (a) means for recovering the coated metal particles and (b) means for transporting said coated metal particles from the recovery means (a) to the group of means for high dispersion treatment of particles. Alternatively, the recoating supply means is furnished with (a) means for recovering the coated metal particles, (b) means for transporting said coated metal particles from the recovery means (a) to the group of means for high dispersion treatment of particles, and (c) means for classifying the coated metal particles. Given large coating weights, the particle size distribution of the coated metal particles will vary from that of the particles in the powder of uncoated core particles. Under these conditions, it is effective to perform the recoating operation after the particle size distribution of the coated metal particles is adjusted by the classifying means (c).

The recoating operation may be repeated depending on the need and the coating weight of the coat forming substance can be set to a desired level. If necessary, the coating operation may be repeated with the type of the coat forming substance varied and, thus, a substance of more than one component can be coated in multiple layers as the coat forming substance.

The equipment for producing coated metal particles that is to be used in the present invention is in no way limited as long as it is capable of applying the coat forming substance over the surfaces of the particles in the powder of core particles by vapor-phase processes involving transition through the vapor phase. For example, chemical vapor deposition (CVD) equipment can be used, as exemplified by a thermal CVD apparatus, a plasma-assisted CVD apparatus, apparatus for CVD utilizing electromagnetic waves (i.e., visible light CVD, laser CVD, ultraviolet CVD, infrared CVD and far-infrared CVD) and a MOCVD apparatus. Alternatively, physical vapor deposition (PVD) equipment can be used, as exemplified by a vacuum evaporation apparatus, an ion sputtering apparatus and an ion plating apparatus. Stated more specifically, a suitable apparatus for producing coated particles is described in the official gazette of Unexamined Published Japanese Patent Application (kokai) Hei 3-75302, entitled "Particles Coated with Superfine Grains on the Surfaces and A Process for Producing Such Coated Particles".

As described on the foregoing pages, the process of the present invention for producing coated metal comprises the steps of charging into the coating space the particles in the powder of core particles which are metal particles and then permitting the precursor of the coat forming substance which is generated via the vapor phase and/or the precursor of the coat forming substance in a vapor-phase state to contact and/or impinge against the particles in said powder of core particles so that their surfaces are coated with the coat forming substance. Five basic processes for coating the core particles composed of metal particles with the coat forming substance are summarized below.

I. A coating method comprising:

(A) a dispersing step in which the particles in the powder of core particles are dispersed in a gaseous atmosphere by the group of means for high dispersion treatment of particles so as to make a mixture of a gas and the particles in a powder of highly dispersed core particles; and (B) a coating step in which the core particles in said gas-particle mixture, as they have been dispersed with the dispersity β adjusted to the values within the ranges set forth above, are allowed to contact and/or impinge against the coat forming substance in the coating start region of the coating space, thereby starting the coating operation.

II. A coating method comprising:

(A) a dispersing step in which the particles in the powder of particles are dispersed in a gaseous atmosphere by the group of means for high dispersion treatment of particles which realize the adjustment of dispersity β to the values within the ranges set forth above in accordance with the particle size, thereby making a mixture of a gas and the particles in a powder of highly dispersed core particles; and (B) a coating step in which the core particles in said gas-particle mixture, as they have been dispersed with the dispersity β adjusted to the values within the ranges set forth above, are allowed to contact and/or impinge against the coat forming substance in the coating start region of the coating space, thereby starting the coating operation.

III. A coating method comprising:

(A) a dispersing step in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles;

(B) a transport step in which the highly dispersed core particles in said gas-particle mixture are transported directly to a subsequent coating step; and (C) the coating step in which the transported core particles in said gas-particle mixture, as they have been dispersed with the dispersity β adjusted to the values within the ranges set forth above, are allowed to contact and/or impinge against the coat forming substance in the coating start region of the coating space, thereby starting the coating operation.

IV. A coating method comprising:

(A) a dispersing step in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles;

(B) a transport step in which the highly dispersed core particles in said gas-particle mixture are transported via at least one member indispensable to transport that is selected from the group consisting of a hollow member, an intermediate member composed of a member that forms a hollow portion, and a pipe; and (C) a coating step in which the transported core particles in said gas-particle mixture, as they have been dispersed with the dispersity β adjusted to the values within the ranges set forth above, are allowed to contact and/or impinge against the coat forming substance in the coating start region of the coating space, thereby starting the coating operation.

V. A coating method comprising:

(A) a dispersing step in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles;

(B) a transport step in which the highly dispersed core particles in said gas-particle mixture are transported to a subsequent coating step via at least one means selected from the group consisting of means for maintaining the dispersion in a gaseous atmosphere of the highly dispersed core particles in said gas-particle mixture, means for enhancing the dispersion in a gaseous atmosphere of the highly dispersed core particles in said gas-particle mixture, and means for separating a mixture of a gas and the particles in a powder of less highly dispersed core particles from said gas-particle mixture so as to select a mixture of a gas and the particles in a powder of highly dispersed core particles in which the core particles are present in the gaseous atmosphere mainly in a single-particle state; and (C) the coating step in which the transported particles in said mixture of a gas and the powder of highly dispersed core particles, as they have been dispersed with the dispersity β adjusted to the values within the ranges set forth above, are allowed to contact and/or impinge against the coat forming substance in the coating start region of the coating space, thereby starting the coating operation.

In each of the coating methods I–V, it is preferred that the coating start region of the coating space is located in either one of the following portions of the space region in which the dispersity β of the particles in the powder of highly dispersed core particles as mixed with a gas and which have been dispersed by the group of means for high dispersion treatment of particles is adjusted to the values within the ranges set forth above:

the space region that includes planes through which all particles in the powder of highly dispersed core particles as mixed with a gas will pass; or the space region that includes planes through which all particles to be recovered into the recovery section of the recovery means will pass.

Alternatively, in each of the coating methods I and II, it is preferred that at least one part of the dispersing step, in which the particles in the powder of core particles are dispersed in a gaseous atmosphere by the group of means for high dispersion treatment of particles which realize the adjustment of dispersity β to the values within the ranges set forth above, thereby making a mixture of a gas and the particles in a powder of highly dispersed core particles, is performed sharing one or more parts of the space with at least one part of the coating step.

It should be noted here that the coated metal particles occasionally form lumps as a result of association of several particles that contact one another via the coat forming substance on the coated particles. Thus, the powder of the coated metal particles consists of coated particles in a single-particle state, lumps formed by the association of from several to several tens of such discrete coated particles as a result of contacting one another, and larger lumps formed by the association of more of such discrete coated particles as a result of contacting one another, and the shapes and sizes of the particles and lumps are nonuniform and irregular. The lumps which are the associations of the discrete coated particles are preferably disagglomerated and/or otherwise reduced in size before they are subjected to the shaping (molding) or sintering process. To disagglomerate and/or otherwise reduce in size the associating lumps of the coated metal particles, various disagglomerating means may be utilized, as exemplified by ball mills, vibrating ball mills, mortars and jet mills, etc. Alternatively, the discrete coated particles may be selectively separated from the associating lumps of such discrete coated particles, so that only the discrete coated particles can be subjected to the shaping or sintering process.

In accordance with the present invention, the thus coated metal particles are then sintered at pressure and temperature that are commonly used for sintering metal particles to obtain a metal-base sinter.

As described above, the coated metal particles to be used in the present invention have their surfaces coated with the coat forming substance by vapor-phase processes and, hence, the coat forming substance that can be used is basically unlimited. While materials design of metal-base sinters can be made in any suitable manners depending on their use, the coating of metal particles with the coat forming substance may be preceded by preliminary coating of the surfaces of those surfaces with a similar and/or dissimilar coat forming substance by a similar and/or dissimilar coating technique.

Take, for example, the case where the surfaces of metal particles are to be eventually provided with coats formed of a desired metal carbide; in this case, those metal particles may be preliminarily coated with carbon. While the preliminary coating technique is not limited in any particular way, suitable examples include not only the molten salt dip method which is described in Unexamined Published Japanese Patent Application (kokai) Hei 2-252660 but also electroplating, electroless plating, cladding, physical vapor deposition processes (e.g., sputtering and ion plating) and chemical vapor deposition processes. The metals in the metal components to be eventually coated are not limited to any particular types as long as they are within the class of substances that can be applied as substances making bonding materials and/or sintering aids for the purpose of the invention.

Metal-Base Sinter

The metal-base sinter of the invention is produced by sintering the coated metal particles or a mixture containing such coated metal particles.

The metal-base sinter is shaped from the coated metal particles or a mixture containing them preferably by at least one technique selected from among injection molding, stamping, slip casting, hot extrusion, cold extrusion, etc.

After being thusly shaped by injection molding, stamping, hot extrusion, cold extrusion, etc., the coated metal particles or mixtures containing them may as required be subjected to secondary shaping such as plastic working, forging or cutting.

Alternatively, preliminary sintering may be performed to form a presinter, which is then subjected to final sintering after the necessary processing.

The thus shaped coated metal particles or mixtures containing them are sintered by conventionally known sintering techniques. Specifically, they are sintered by at least one technique selected from among vacuum sintering or atmospheric sintering, hot pressing, capsule HIP, pseudo-HIP, capsule-free HIP, capsule superhigh pressure HIP, capsule-free superhigh pressure HIP, superhigh pressure sintering, etc. To describe HP as an applicable sintering method, it starts with placing the coated metal particles in a SiC mold in an HP apparatus, with the surfaces of the particles being coated with a coat forming substance. The punch is then set in position. Degassing is repeated several times at $10^{-3}$ torr. Thereafter, with an Ar gas being admitted to flow, pressure is applied and heating is effected to a predetermined sintering temperature and the pressure and temperature are held for a predetermined time to effect sintering. Subsequently, the sinter is furnace cooled and the pressure is opened to atmosphere for recovering the sinter.

The sintering temperature varies with the specific metal to be used and may range from about 400° C. (for aluminum) to 2000° C. (for tungsten) and even higher.

If desired, the above-described sequential shaping and sintering steps may be replaced by hot pressing which performs sintering and shaping simultaneously. Because of the grain boundary control by the coat forming substances, a strong sinter structure can be produced without involving grain growth even at comparatively high temperatures and, hence, one can perform sintering with comparatively high temperature settings.

In this way, one can obtain a metal-base sinter of high performance that is composed of characteristic coated fine metal particles that has a uniform, dense and highly-controlled microstructure with a controlled distribution of a bonding materiel and/or a sintering aid.

According to the present invention, a powder of metal core particles is dispersed in a gaseous atmosphere and the core particles thus dispersed to a dispersity $\beta$ of at least 70%, at least 80%, at least 90%, at least 95%, at least 97% or at least 99% in accordance with an average diameter of the core particles allowed to contact or impinge a precursor of a coat forming substance, whereby the core particles are covered on their surfaces with the coat forming substance in a single-particle state, thus coated metal particles can be prepared. Moreover, in accordance with the present invention, by sintering the coated metal particles a metal-base sinter of high performance were produced that had uniform, dense, firmly sintered and highly controlled microstructure.

EXAMPLES

The present invention is described below with reference to examples.

Example 1

Tungsten particles having an average diameter ($D_M$) of 1 $\mu$m and a frequency distribution by volume of ($[D_M/5, 5D_M]$, $\geq 90\%$) were coated with titanium nitride.

Figure 6:
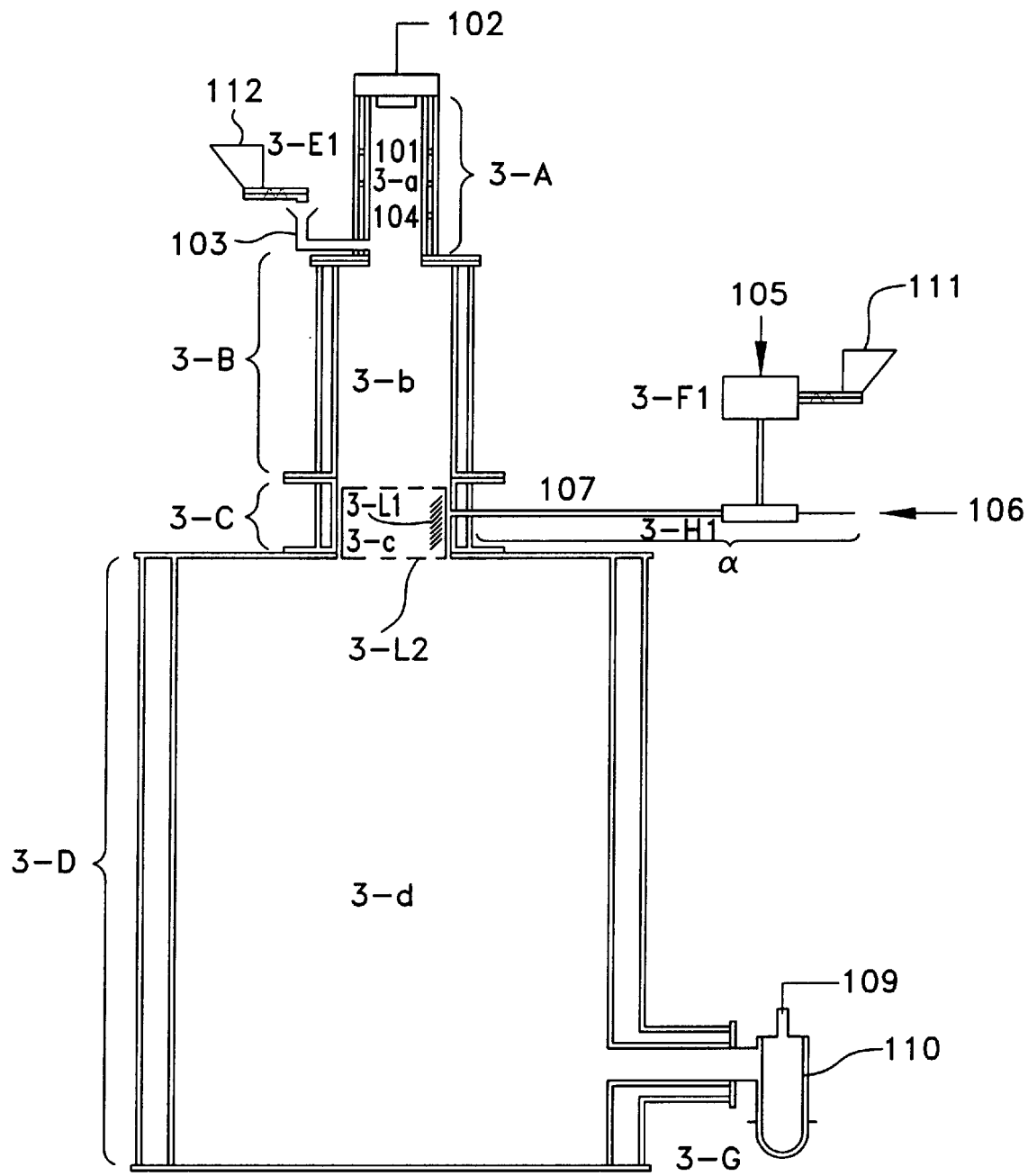
FIG. 6 is a diagram showing the apparatus used in Example 1.
Figure 7:
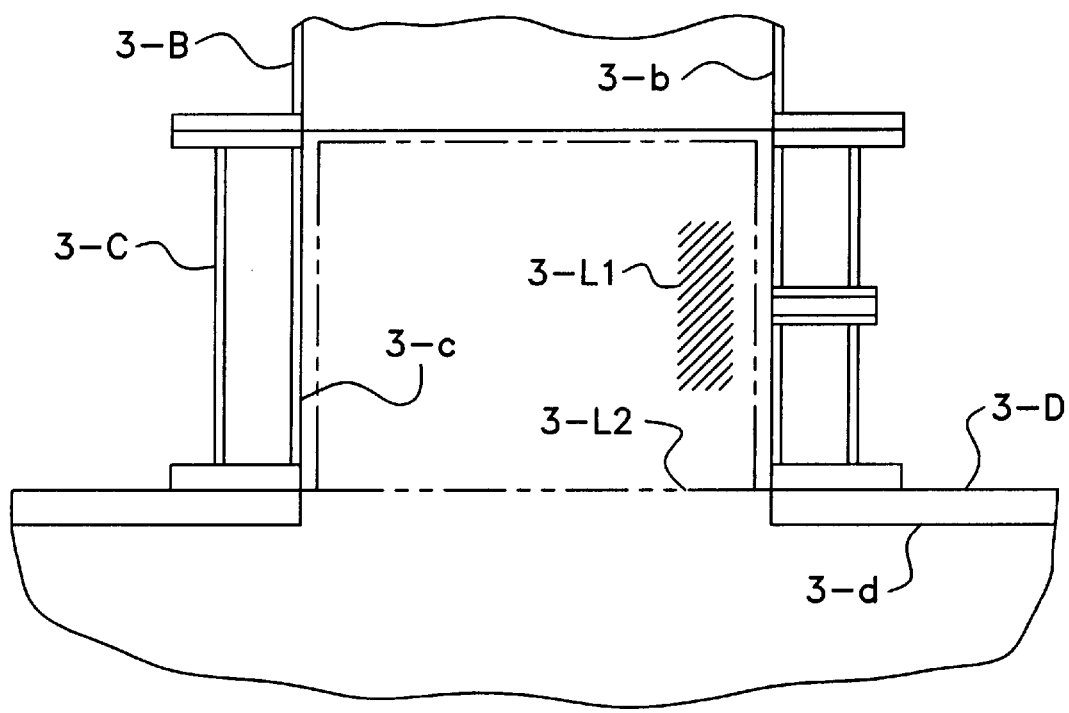
FIG. 7 is a partial enlarged view of the apparatus used in Example 1.

The construction of the apparatus used is shown in FIG. 6 and FIG. 7 which is a partial enlarged view of FIG. 6; the apparatus is a specific example of the design shown in FIG. 5a.

As shown, the apparatus comprises: a plasma torch 3-A including a plasma chamber 3-a, a vessel 3-B for cooling a coat forming substance precursor generating chamber 3-b, a coating chamber cooling vessel 3-C in the narrow sense of the term, a coating chamber 3-c in the narrow sense of the term, a vessel 3-D for cooling a coated particle cooling chamber 3-d, a supply unit 3-E1 on the side where the feed of the coat forming substance is supplied, an agitating disperser 3-F1 and an ejector-type disperser 3-H1 which are on the side where a powder of core particles is supplied, a capillary disperser 107, and a coated particle recovery section 3-G. The supply unit 3-E1 is coupled to a feeder 112 equipped with a vessel for supplying the feed powder of the coat forming substance, and the agitating disperser 3-F1 is coupled to a feeder 111 equipped with a vessel for supplying the powder of core particles composed of the metal particles. According to the definition, the coating chamber used in Example 1 is composed of the plasma chamber 3-a, the coat forming substance precursor generating chamber 3-b, the coating chamber 3-c in the narrow sense of the term, and the coated particle cooling chamber 3-d. These make up the coating chamber in the broad sense of the term and the chamber 3-c where most part of the coating operation is performed is referred to as the "coating chamber in the narrow sense of the term".

The group of means for high dispersion treatment of particles α used in Example 1 is composed of the feeder 111 equipped with a supply vessel, agitating disperser 3-F1, ejector-type disperser 3-H1, and the capillary disperser 107 which is made of a stainless steel pipe having an inside diameter of 4 mm. The basic concept of the group is shown in FIG. 2a and it is a specific example of the group of means for high dispersion treatment of particles that is of the design shown in FIG. 3b. The group is designed in such a way that it can realize an output value $\beta$ of at least 70% ($\beta \geq 70\%$) given the particles in a powder of metal core particles that are characterized by ($[D_M/5, 5D_M]$, $\geq 90\%$) where $D_M=1$ $\mu$m. The capillary disperser 107 which is the final means of treatment in the group of means for high dispersion treatment of particles is coupled directly to the coating chamber 3-c and designed in such a way as to realize $\beta \geq 70\%$ in the coating start region 3-L1 of the coating space 3-L2.

A gas jet port 101 is provided on top of the plasma torch 3-A and an argon gas is supplied from a supply source 102 through this port at a rate of 20 L/min. The supplied argon gas is turned into a plasma by applied high-frequency waves, thereby forming a plasma flame in the plasma chamber 3-a within the plasma torch 3-A.

A titanium nitride powder comprising particles with an average diameter of 2 $\mu$m serves as the feed of the coat forming substance and is supplied from the feeder 112 equipped with a vessel for supplying the feed powder of the coat forming substance. The supplied silicon powder is carried by a carrier gas 103 flowing at a rate of 5 L/min so that it is introduced into the plasma flame at a rate of 0.8 g/min via an inlet 104 provided at the bottom of the plasma torch 3-A. Being evaporated by the heat of the plasma flame, the silicon powder goes through the vapor phase to become the precursor of the coat forming substance in the precursor generating chamber 3-b.

The tungsten core particles with an average diameter of 1 $\mu$m are supplied at a rate of 10.0 g/min from the feeder 111 equipped with a supply vessel of the core particles and they are dispersed with the agitating disperser 3-F1 while being carried by a carrier gas 105 that is supplied at a rate of 5 L/min. The particles are then dispersed to a dispersity ($\beta$) of 82% by means of the ejector-type disperser 3-H1 and the capillary disperser 107 with the aid of a dispersing gas 106 that is supplied at a flow rate of 10 L/min. The thusly dispersed core particles are introduced into the coating chamber.

The highly dispersed tungsten particles entering the coating start region 3-L1 of the coating space 3-L2 start to contact and/or impinge against the precursor of the coat forming substance as they maintain the dispersity $\beta$ at 82%.

Thus, the metal particles are given the coat of the coat forming substance on their surfaces and they descend down the coated particle cooling chamber 3-d together with the gas, eventually reaching the recovery section 3-G. The product comprising the coated particles is separated from the gas 109 by means of a filter 110 and collected for recovery. Thus, the coated particles in which titanium nitride was coated 20% by volume on the tungsten particles were obtained.

Figure 8A:
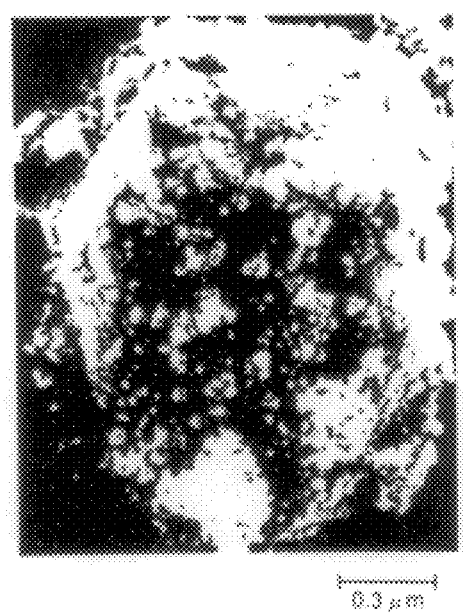
FIGS. 8a and 8b are scanning electron micrographs showing two of the coated metal particles produced in Example 1 and 2 respectively.

The recovered tungsten particles having titanium nitride coats on the surfaces were examined with a scanning electron microscope. As FIG. 8a shows, all of these particles were uniformly coated with superfine titanium nitride particles of about 0.005 $\mu$m in size.

Example 2

TiAl intermetal compound particles having an average diameter ($D_M$) of 40 μm and a frequency distribution by volume of ($[D_M/5, 5D_M]$, ≧90%) were coated with titanium boride (TiB$_2$) which is borides of metallic titanium.

The apparatus used is the same as used in Example 1.

The group of means for high dispersion treatment of particles α used in Example 2 is designed in such a way that it can realize an output value β of at least 90% (β≧90%) given the particles in a powder of metal core particles that are characterized by ($[D_M/5, 5D_M]$, ≧90%) where $D_M$=40 μm. The capillary disperser 107 which is the final means of treatment in the group of means for high dispersion treatment of particles is coupled directly to the coating chamber 3-*c* and designed in such a way as to realize β≧90% in the coating start region 3-L1 of the coating space 3-L2.

A titanium boride powder comprising particles with an average diameter of 2 μm serves as the feed of the coat forming substance and is supplied from the feeder 112 equipped with a vessel for supplying the feed powder of the coat forming substance. The supplied titanium boride powder is carried by a carrier gas 103 flowing at a rate of 5 L/min so that it is introduced into the plasma flame at a rate of 0.2 g/min via an inlet 104 provided at the bottom of the plasma torch 3-A. Being evaporated by the heat of the plasma flame, the titanium boride powder goes through the vapor phase to become the precursor of the coat forming substance in the precursor generating chamber 3-*b*.

The TiAl intermetal compound core particles with an average diameter of 20 μm are supplied at a rate of 2.0 g/min from the feeder 111 equipped with a supply vessel of the core particles and they are dispersed with the agitating disperser 3-F1 while being carried by a carrier gas 105 that is supplied at a rate of 5 L/min. The particles are then dispersed to a dispersity (β) of 94% by means of the ejector-type disperser 3-H1 and the capillary disperser 107 with the aid of a dispersing gas 106 that is supplied at a flow rate of 10 L/min. The thusly dispersed core particles are introduced into the coating chamber.

The highly dispersed TiAl intermetal compound particles entering the coating start region 3-L1 of the coating space 3-L2 start to contact and/or impinge against the precursor of the coat forming substance as they maintain the dispersity β at 94%.

Figure 8B:
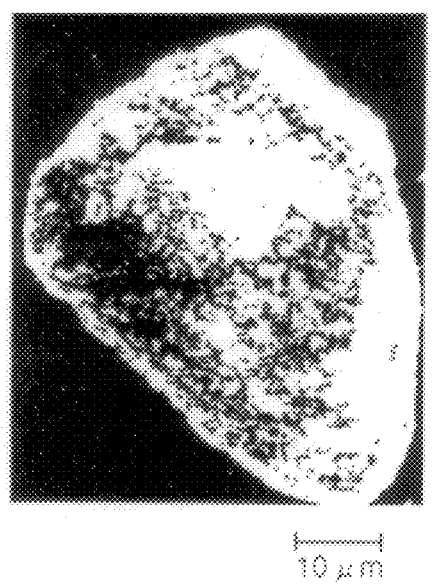

The recovered TiAl intermetal compound particles having titanium boride coats on the surfaces were examined with a scanning electron microscope. As FIG. 8*b* shows, all of these particles were uniformly coated with superfine titanium boride particles of about 0.005 μm in size. The titanium boride coating was in an amount of 20% by volume.

Example 3

Nickel particles having an average diameter ($D_M$) of 2 μm and a frequency distribution by volume of ($[D_M/5, 5D_M]$, ≧90%) were coated with aluminum.

Figure 9:
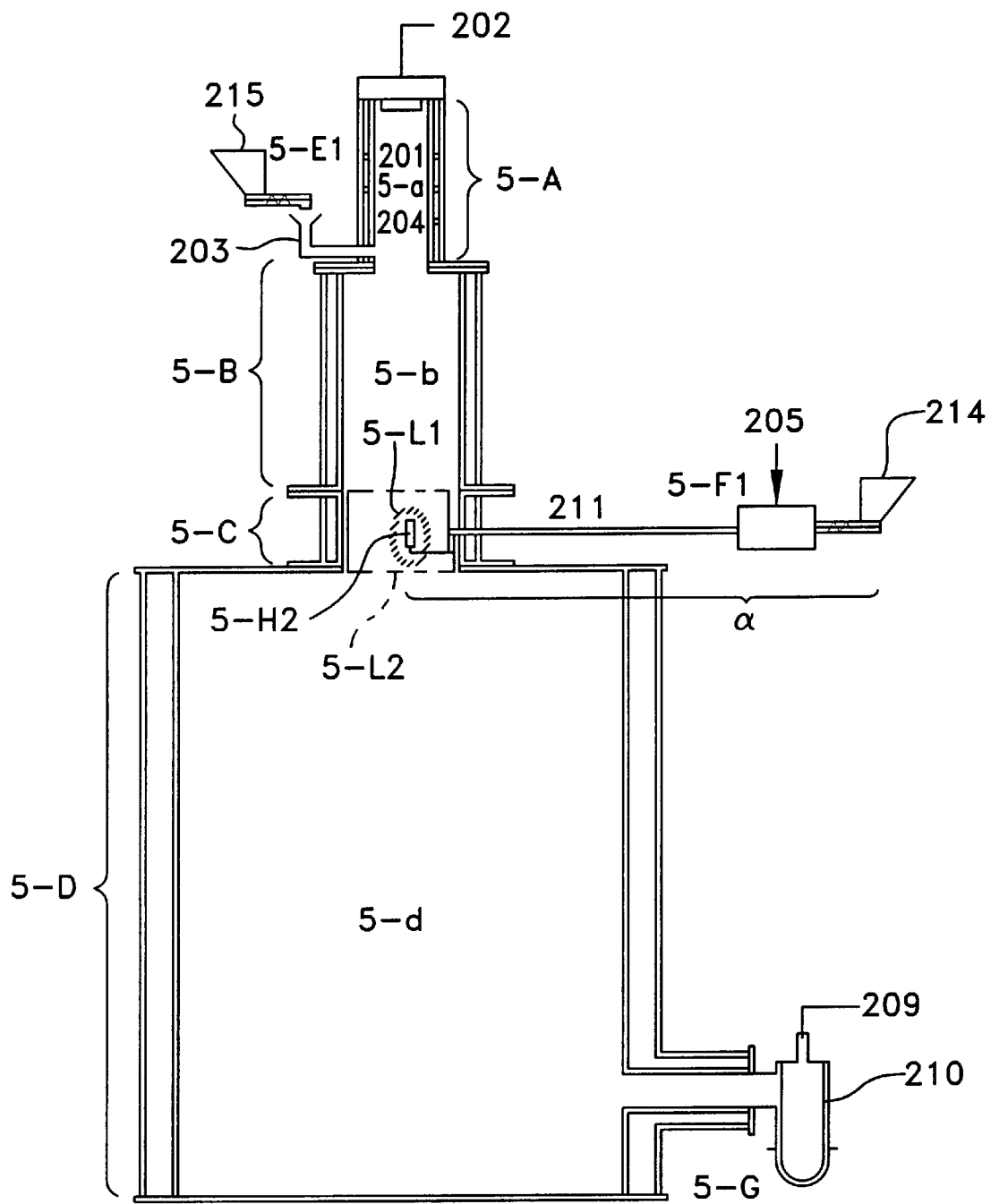
FIG. 9 is a diagram showing the apparatus used in Example 3.
Figure 10:
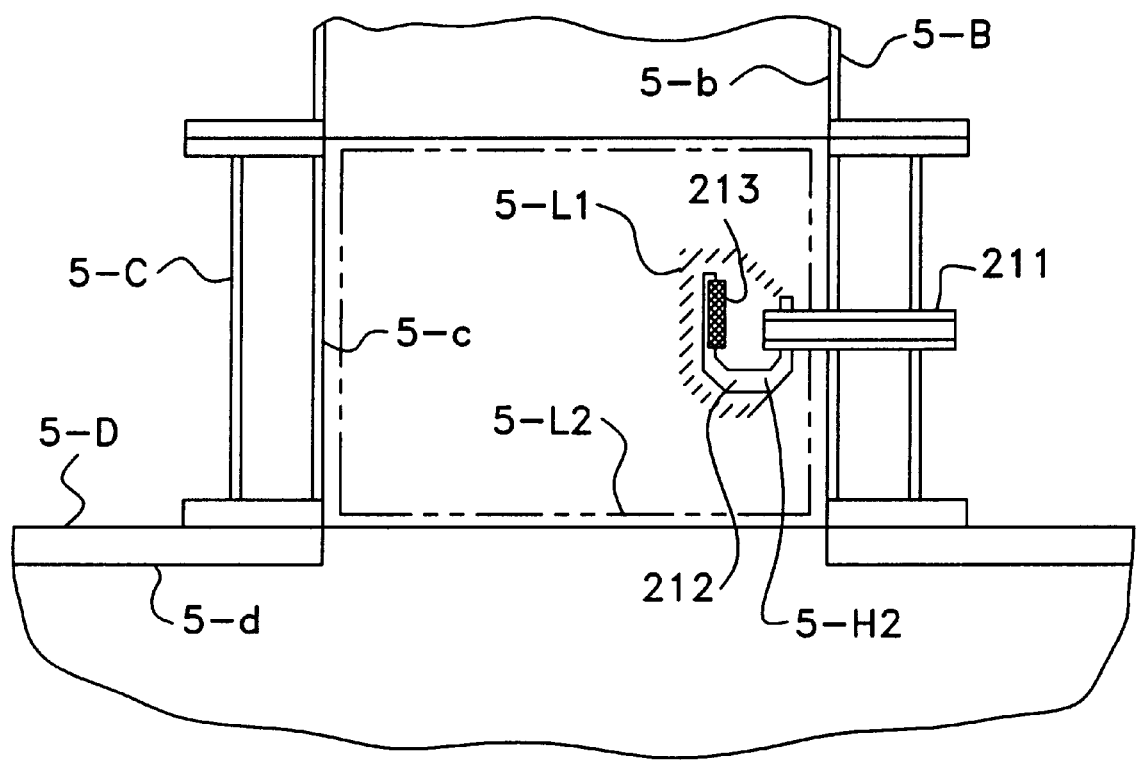
FIG. 10 is a partial enlarged view of the apparatus used in Example 3.

The construction of the apparatus used is shown in FIG. 9 and FIG. 10 which is a partial enlarged view of FIG. 10; the apparatus is a specific example of the design shown in FIG. 5*d*.

As shown, the apparatus comprises: a plasma torch 5-A including a plasma chamber 5-*a*, a vessel 5-B for cooling a coat forming substance precursor generating chamber 5-*b*, a coating chamber cooling vessel 5-C in the narrow sense of the term, a coating chamber 5-*c* in the narrow sense of the term, a vessel 5-D for cooling a coated particle cooling chamber 5-*d*, a supply unit 5-E1 on the side where the feed of the coat forming substance is supplied, an agitating disperser 5-F1 which is on the side where a powder of core particles is supplied, a capillary disperser 211 and a disperser 5-H2 that utilizes an impingement plate, and a coated particle recovery section 5-G. That part of this apparatus which was to generate the precursor of the coat forming substance was of the same design as in Example 1. The group of means for high dispersion treatment of particles a was composed of a feeder 214 equipped with a supply vessel, the agitating disperser 5-F1, the capillary disperser 211, and the disperser 5-H2 that utilizes an impingement plate. The basic concept of the group α is shown in FIG. 2*a* and it is a specific example of the group of means for high dispersion treatment of particles that is of the design shown in FIG. 3*b*. The capillary disperser 211 is made of a stainless steel pipe having an inside diameter of 4 mm. The disperser 5-H2 is the final means of treatment in the group of means for high dispersion treatment of particles α and it consists of a SiC impingement plate 213 supported by a stainless steel holder 212. The disperser 5-H2 is contained in the coating chamber 5-*c* in the narrow sense of the term, which shares the space with the group of means for high dispersion treatment of particles α. A coating space 5-L1 and the coating start region 5-L2 of the coating space are also contained in the coating chamber 5-*c* in the narrow sense of the term. The group of means α in the apparatus of Example 3 has such performance that the particles in a powder of core particles having an average diameter ($D_M$) of 2 μm and a frequency distribution by volume of ($[D_M/5, 5D_M]$, ≧90%) can be dispersed to a dispersity (β) of at least 70% (β≧70%) right after impingement against the plate 213 in the disperser 5-H2 at the last stage of dispersion treatment. Therefore, coating of the core particles starts with the dispersity β held at 70% and above.

A gas jet port 201 is provided on top of the plasma torch 5-A and an argon gas is supplied from a supply source 202 through this port at a rate of 20 L/min. The supplied argon gas is turned into a plasma by applied high-frequency waves, thereby forming a plasma flame in a plasma chamber 5-*a* within the plasma torch 5-A.

An aluminum powder comprising particles with an average diameter of 2 μm serves as the feed of the coat forming substance and is supplied at a rate of 0.3 g/min from a feeder 215 equipped with a vessel for supplying the feed powder of the coat forming substance. The supplied aluminum powder is carried by a carrier gas 203 flowing at a rate of 5 L/min so that it is introduced into the plasma flame via an inlet 204 of the feed of the coat forming substance provided at the bottom of the plasma torch 5-A. Being evaporated by the heat of the plasma flame, the aluminum powder goes through the vapor phase to become the precursor of the coat forming substance in a coat forming substance precursor generating chamber 5-*b*.

The core particles of nickel are supplied at a rate of 2.0 g/min from the feeder 214 equipped with a vessel for supplying the powder of core particles and they are dispersed with the agitating disperser 5-F1 while being carried by a carrier gas 205 that is supplied at a rate of 20 L/min. The particles then pass through the capillary disperser 211 to enter the disperser 5-H2 with the impingement plate in the coating chamber, in which they are dispersed in a gaseous atmosphere to a dispersity (β) of 82%.

The highly dispersed nickel core particles, entering the coating start region 5-L1 of the coating space 5-L2 start to contact and/or impinge against the precursor of the coat forming substance as they maintain the dispersity β of 82%.

Thus, the metal particles are given the coat of the coat forming substance on their surfaces and they descend down a coated particle cooling chamber 5-d together with the gas, eventually reaching a coated particle recovery section 5-G. The product comprising the coated metal particles is separated from the gas by means of a filter 210 and collected for recovery. The recovered aluminum nickel particles had aluminum coats in an amount of 15% by volume.

The recovered nickel particles having aluminum coats on their surfaces were examined with a scanning electron microscope. All of those particles were uniformly coated with superfine aluminum particles of about 0.005 μm in size.

Example 4

Tungsten particles having an average diameter ($D_M$) of 15 μm and a frequency distribution by volume of ($[D_M/5, 5D_M/2]$, $\geq 90\%$) were titanium nitride (TiN) coated with alumina.

The apparatus used is the same as used in Example 3.

The group of means for high dispersion treatment of particles in the apparatus of Example 3 has such performance that the particles in a powder of core particles having an average diameter ($D_M$) of 15 μm and a frequency distribution by volume of ($[D_M/5, 5D_M]$, $\geq 90\%$) can be dispersed to a dispersity (β) of at least 80% (β$\geq$70%) right after impingement against the plate 213 in the disperser 5-H2 at the last stage of dispersion treatment. Therefore, coating of the core particles can start with the dispersity β held at 80% and above.

A titanium nitride powder comprising particles with an average diameter of 2 μm serves as the feed of the coat forming substance and is supplied at a rate of 1.2 g/min from a feeder 215 equipped with a vessel for supplying the feed powder of the coat forming substance. The supplied titanium nitride powder is carried by a carrier gas 203 flowing at a rate of 5 L/min so that it is introduced into the plasma flame via an inlet 204 of the feed of the coat forming substance provided at the bottom of the plasma torch 5-A. Being evaporated by the heat of the plasma flame, the titanium nitride powder goes through the vapor phase to become the precursor of the coat forming substance in a coat forming substance precursor generating chamber 5-b.

The core particles of tungsten are supplied at a rate of 2.5 g/min from the feeder 214 equipped with a vessel for supplying the powder of core particles and they are dispersed with the agitating disperser 5-F1 while being carried by a carrier gas 205 that is supplied at a rate of 20 L/min. The particles then pass through the capillary disperser 211 to enter the disperser 5-H2 with the impingement plate in the coating chamber, in which they are dispersed in a gaseous atmosphere to a dispersity (β) of 89%.

The highly dispersed tungsten core particles, entering the coating start region 5-L1 of the coating space 5-L2 start to contact and/or impinge against the precursor of the coat forming substance as they maintain the dispersity β of 89%.

The recovered tungsten particles having titanium nitride coats on their surfaces were examined with a scanning electron microscope. All of those particles were uniformly coated with superfine titanium nitride particles of about 0.005 μm in size. The titanium nitride coating amount was in an amount of 20% by volume.

Example 5

Nickel particles having an average diameter ($D_M$) of 2 μm and a frequency distribution by volume of ($[D_M/5, 5D_M]$, $\geq 90\%$) were coated with aluminum.

Figure 11:
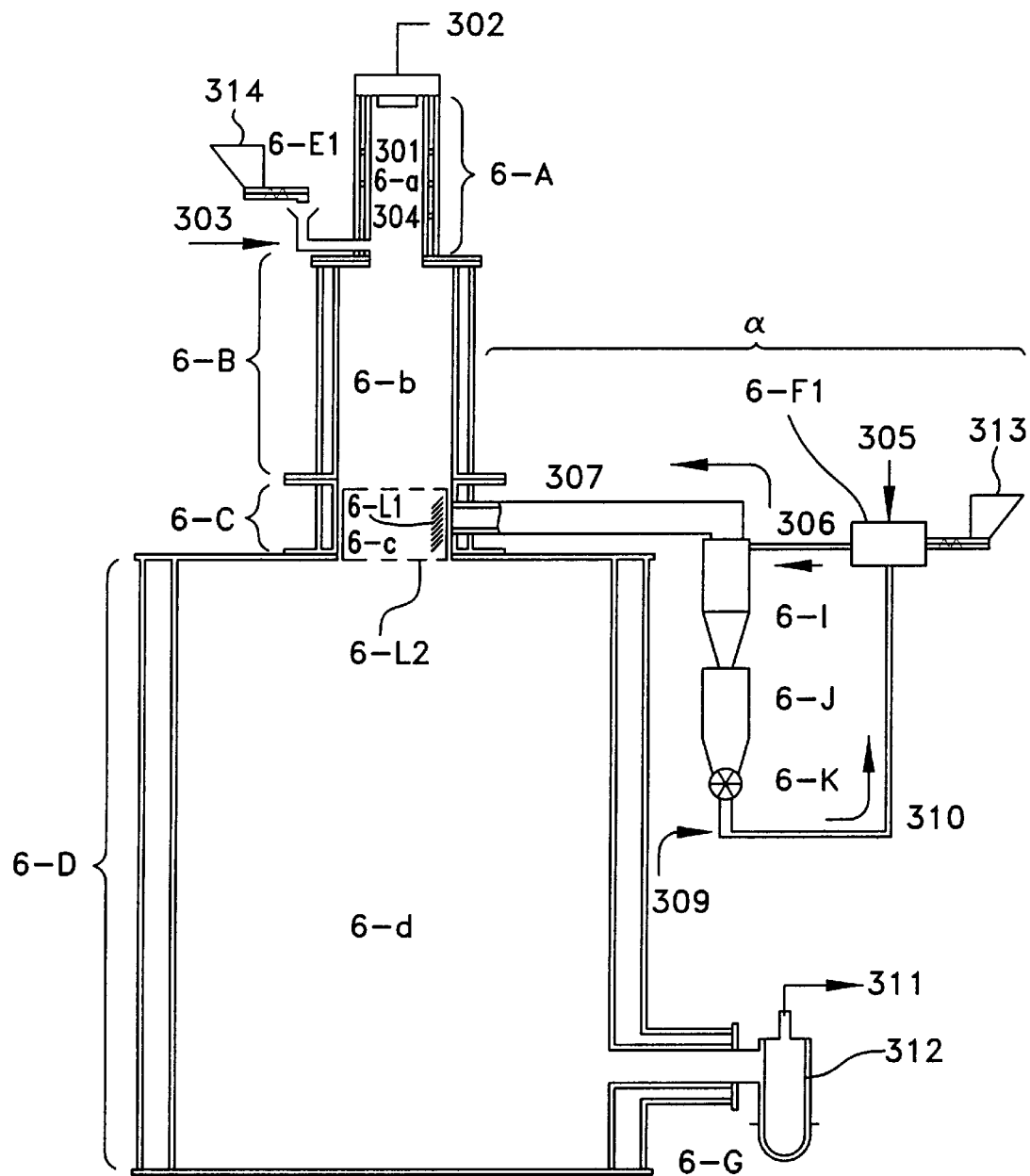
FIG. 11 is a diagram showing the apparatus used in Example 5.
Figure 12:
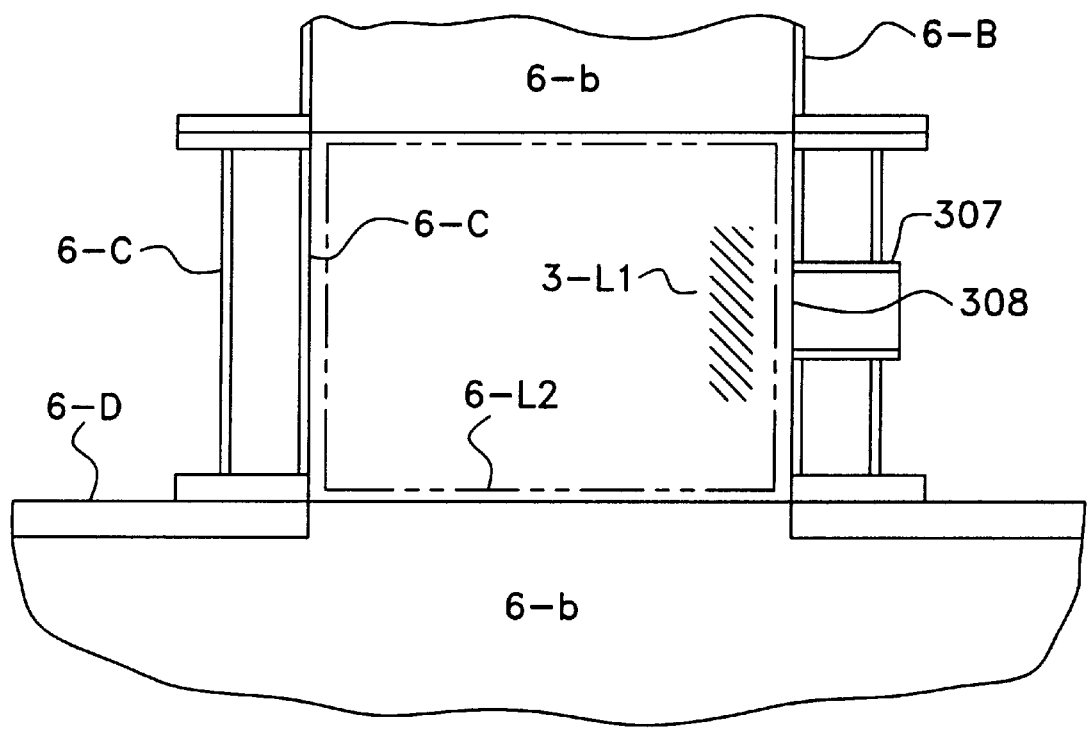
FIG. 12 is a partial enlarged view of the apparatus used in Example 5.

The construction of the apparatus used is shown in FIG. 11 and FIG. 12 which is a partial enlarged view of FIG. 11; the apparatus is a specific example of the design shown in FIG. 5b.

As shown, the apparatus comprises: a plasma torch 6-A including a plasma chamber 6-a, a vessel 6-B for cooling a coat forming substance precursor generating chamber 6-b, a coating chamber cooling vessel 6-C in the narrow sense of the term, a coating chamber 6-c in the narrow sense of the term, a vessel 6-D for cooling a coated particle cooling chamber 6-d, a supply unit 6-E1 on the side where the feed of the coat forming substance is supplied, an agitating disperser 6-F1, a cyclone 6-I, a hopper 6-J and a rotary value 6-K which are on the side where a powder of core particles is supplied, a pipe 307 inevitable to transport, and a coated particle recovery section 6-G. That part of this apparatus which was to generate the precursor of the coat forming substance was of the same design as in Example 1.

The group of means for high dispersion treatment of particles a was composed of a feeder 313 equipped with a supply vessel, the agitating disperse 6-F1 which is dispersing means, and the cyclone 6-I which is means for selecting a mixture of a gas and the particles in a powder of highly dispersed core particles. The basic concept of the group a is shown in FIG. 2b and it is a specific example of the design shown in FIG. 3d. The section of cyclone 6-I discharging the mixture of a gas and the particles in a powder of highly dispersed core particles is connected to the coating chamber 6-c in the narrow sense of the term by means of the pipe 307 inevitable to transport, whereas the section of cyclone 6-I discharging the powder portion consisting of less highly dispersed core particles is connected to the agitating disperser 6-F1 by means of a transport pipe 310 via the hopper 6-J and the rotary valve 6-K. Using the group of means a in the apparatus of Example 5, the particles in a powder of core particles having an average ($D_M$) of 2 μm and a frequency distribution by volume of ($[D_M/5, 5D_M]$, $\geq 90\%$) can be dispersed to a dispersity (b) of at least 75% in the section of cyclone 6-I (i.e., the means of final treatment) discharging the powder stream of highly dispersed particles. As shown in FIGS. 11 and 12, the coating space 6-L2 and the coating start region 6-L1 of this coating space are contained in the coating chamber 6-c in the narrow sense of the term. Because of the constraint by the flange portion coupling a coating chamber cooling vessel 6-C in the narrow sense of the term with the vessel 6-D for cooling the coated particle cooling chamber 6-d, the pipe 307 was indispensable to transport, but the resulting drop in dispersity b could be held at a reduced level. Hence, coating of the core particles starts with the dispersity b held at 70% and above in the coating start region.

A gas jet port 301 is provided on top of the plasma torch 6-A and an argon gas is supplied from a supply vessel 302 through this port at a rate of 20 L/min. The supplied argon gas is turned into a plasma by applied high-frequency waves, thereby forming a plasma flame in the plasma chamber 6-a within the plasma torch 6-A.

An aluminum powder serving as the feed of the coat forming substance is supplied at a rate of 0.3 g/min from a feeder 314 equipped with a vessel for supplying the feed powder of the coat forming substance. The supplied aluminum powder is carried by a carrier gas 303 flowing at a rate of 5 L/min so that it is introduced into the plasma flame via an inlet 304 the feed of the coat forming substance provided at the bottom of the plasma torch 6-A. Being evaporated by the heat of the plasma flame, the aluminum powder goes through the vapor phase to become the precursor of the coat forming substance in the coat forming substance precursor generating chamber 6-b.

Nickel core particles are supplied at a rate of 2.0 g/min from the feeder 313 equipped with a vessel for supplying the powder of core particles and they are dispersed with the agitating disperser 6-F1 while being carried by a carrier gas 305 that is supplied at a rate of 15 L/min. The particles then pass through a pipe 306 and thence enter the cyclone 6-I. The cyclone 6-I is adjusted in such a way that the fines produced will have a maximum particle diameter of 1.5 µm; a mixture of the gas and the particles in a powder of highly dispersed (b=85%) core particles which are mostly single particles passes through the pipe 307 which is indispensable to transport, so that it is discharged into the coating chamber 6-c in the narrow sense of the term via a discharge port 308. On the other hand, the powder portion consisting of less highly dispersed core particles which have been selectively separated by cyclone 6-I passes through hopper 6-J and rotary valve 6-K to be transported through a pipe 310 by a carrier gas 309 flowing at a rate of 10 L/min so that it is fed back to the agitating disperser 6-F1.

The highly dispersed nickel core particles entering the coating start region 6-L1 of the coating space 6-L2 start to contact and/or impinge against the precursor of the coat forming substance as they maintain the dispersity (b) of 82%.

Thus, the metal particles are given the coat of the coat forming substance on their surfaces and they descend down a coated particle cooling chamber 6-d together with the gas, eventually reaching a coated particle recovery section 6-G. The product comprising the coated metal particles is separated from the gas 311 by means of a filter 312 and collected for recovery.

The recovered nickel particles having aluminum coats on the surfaces were examined with a scanning electron microscope. All of these particles were uniformly coated with superfine aluminum particles of about 0.005 µm in size. The aluminum coating was in an amount of 25% by mol (13.3% by weight).

Example 6

Titanium particles having an average diameter ($D_M$) of 120 µm and a frequency distribution by volume of ($[D_M/5, 5D_M]$, ≧90%) were coated with aluminum.

The apparatus used is the same as used in Example 5. Using the group of means for high dispersion treatment of particles in the apparatus of Example 5, the particles in a powder of core particles having an average ($D_M$) of 120 µm and a frequency distribution by volume of ($[D_M/5, 5D_M]$, ≧90%) can be dispersed to a dispersity (b) of at least 98% in the section of cyclone 6-I (i.e., the means of final treatment) discharging the powder stream of highly dispersed particles. As shown in FIGS. 11 and 12, the coating space 6-L2 and the coating start region 6-L1 of this coating space are contained in the coating chamber 6-c in the narrow sense of the term. Because of the constraint by the flange portion coupling a coating chamber cooling vessel 6-C in the narrow sense of the term with the vessel 6-D for cooling the coated particle cooling chamber 6-d, the pipe 307 was indispensable to transport, but the resulting drop in dispersity b could be held at a reduced level. Hence, coating of the core particles starts with the dispersity b held at 95% and above in the coating start region.

An aluminum powder serving as the feed of the coat forming substance is supplied at a rate of 0.3 g/min from a feeder 314 equipped with a vessel for supplying the feed powder of the coat forming substance. The supplied aluminum powder is carried by a carrier gas 303 flowing at a rate of 5 L/min so that it is introduced into the plasma flame via an inlet 304 the feed of the coat forming substance provided at the bottom of the plasma torch 6-A. Being evaporated by the heat of the plasma flame, the aluminum powder goes through the vapor phase to become the precursor of the coat forming substance in the coat forming substance precursor generating chamber 6-b.

Titanium core particles are supplied at a rate of 3.0 g/min from the feeder 313 equipped with a vessel for supplying the powder of core particles and they are dispersed with the agitating disperser 6-F1 while being carried by a carrier gas 305 that is supplied at a rate of 15 L/min. The particles then pass through a pipe 306 and thence enter the cyclone 6-I. The cyclone 6-I is adjusted in such a way that the fines produced will have a maximum particle diameter of 150 µm; a mixture of the gas and the particles in a powder of highly dispersed (β=98%) core particles which are mostly single particles passes through the pipe 307 which is indispensable to transport, so that it is discharged into the coating chamber 6-c in the narrow sense of the term via a discharge port 308. On the other hand, the powder portion consisting of less highly dispersed core particles which have been selectively separated by cyclone 6-I passes through hopper 6-J and rotary valve 6-K to be transported through a pipe 310 by a carrier gas 309 flowing at a rate of 10 L/min so that it is fed back to the agitating disperser 6-F1.

The highly dispersed titanium core particles entering the coating start region 6-L1 of the coating space 6-L2 start to contact and/or impinge against the precursor of the coat forming substance as they maintain the dispersity (β) of 96%.

The recovered titanium particles having aluminum coats on the surfaces were examined with a scanning electron microscope. All of these particles were uniformly coated with superfine aluminum particles of about 0.005 µm in size. The aluminum coating was in an amount of 50% by mol.

Example 7

The tungsten particles prepared in Example 1 which were coated with titanium nitride were sealed by the glass capsule method and sintered with a HIP apparatus in the following manner.

The coated tungsten particles were stamped into a disk having a diameter of 16 mm and a thickness of 5 mm. The disk was placed in a Pyrex glass capsule, degassed at $10^{-6}$ torr and 400° C. for 12 hr. and thereafter sealed. The thus sealed capsule was set in a HIP apparatus using an argon gas as a pressure-transmitting medium and sintered by being held at a sintering temperature of 1800° C. and at a sintering pressure of 2000 MPa for 3 hr. Following cooling, the pressure was opened to atmosphere for recovering the sinter. The sinter of Example 7 was checked for its crystalline phase by X-ray diffraction and tungsten and titanium nitride were found but other diffraction peaks were not observed.

The sinter was very dense and its density was at least 99% within errors of measurement; in addition, it was with the Vickers microhardness, $H_v$ (0.5/10), being 700.

Figure 13A:
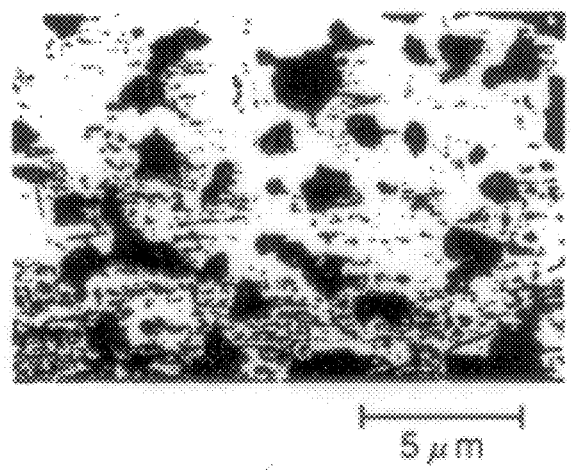
FIGS. 13a and 13b are electron micrographs showing polished surfaces of the sinters produced in Examples 7 and 13, respectively.

The polished surface of the thus obtained sinter was coated with a gold film by a customary evaporation technique and examined with an electron microscope. The result is shown in the FIG. 13a electron micrograph (×5000), from which one can see that the sinter was entirely free from unsintered portions, pores, defects, etc. and that it was comprised of a fine and highly controlled microstructure in which titanium nitride was distributed almost uniformly around the tungsten particles.

Figure 14A:
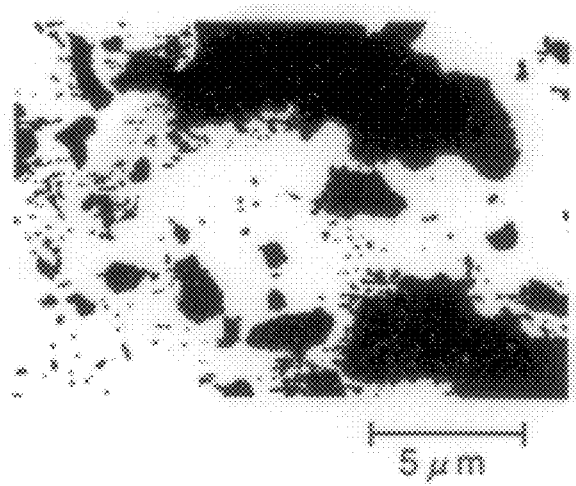
FIGS. 14a and 14b are electron micrographs showing polished surfaces of the sinters in comparative Examples.

For comparison, tungsten particles of the same grade as used in Example 1 were left uncoated with titanium nitride and sintered together with a corresponding amount of titanium nitride fine particles under the same sintering conditions as used in Example 7. The polished surface of the thus prepared sinter was similarly coated with an evaporated gold film and examined with an electron microscope. The result is shown in FIG. 14a, from which one can see that although the sintering conditions were the same, the particles grew to coarse grains and titanium nitride was distributed irregularly, indicating the total failure to control the microstructure of the sinter.

Example 8

The nickel particles prepared in Example 3 which were coated with aluminum were sintered under the same conditions as in Example 7 except that the sintering temperature and sintering time were changed to 1200° C. and 2 hr, respectively. The resulting sinter had a density of 100% and $H_v$ (0.5/10) of 700. According to the X-ray diffraction $Ni_3Al$ was observed. As nearly in Example 7, the sinter had a fine and highly controlled microstructure.

Example 9

The composite coated nickel particles obtained by further coating the surface of the coated particles prepared in Example 5 with 5% by volume of alumina were sintered under the same conditions as in Example 7 except that the sintering temperature and sintering time were changed to 1200° C. and 2 hr, respectively. The resulting sinter had a density of 100% and $H_v$ (0.5/10) of 700. According to the X-ray diffraction $Ni_3Al$ and $\alpha$-$Al_2O_3$ were observed. As in Example 7, the sinter had a fine and highly controlled microstructure.

Example 10

TiAl particles having an average diameter ($D_M$) of 6 μm and a frequency distribution by volume of ($[D_M/5, 5D_M]$, ≧90%) had their surfaces coated with titanium boride by the procedure of Example 3 to yield titanium boride coated TiAl particles consisting of TiAl and $TiB_2$ in a ratio of 95:5 (vol %).

The coated TiAl particles were stamped into a disk having a diameter of 16 mm and a thickness of 5 mm. The disk was set in a hot press (HP) apparatus equipped with a graphite mold packed with a hexagonal boron nitride (h-BN) powder. After degassing to $10^{-3}$ torr and 200° C., an argon gas was admitted into the apparatus while sintering was done with the shaped part being held at a sintering temperature of 1200° C. and at a sintering pressure of 20 MPa for 2 hr. The recovered sinter had a density of 100% and $H_v$ (0.5/10) of about 230. According to the X-ray diffraction TiAl and $TiB_2$ were observed. As in Example 7, the sinter had a fine and highly controlled microstructure.

Example 11

TiAl particles having an average diameter ($D_M$) of 6 μm and a frequency distribution by volume of ($[D_M/5, 5D_M]$, ≧90%) had their surfaces coated with $TiB_2$ (titanium boride) by the procedure of Example 3 to yield $TiB_2$ coated TiAl particles consisting of TiAl and $TiB_2$ in a ratio of 95:5 (vol %).

The coated TiAl particles and $Al_2O_3$ (alumina) whiskers were mixed in a ratio of 85:15 (vol %) and mixtures of $TiB_2$ coated TiAl particles and $Al_2O_3$ whiskers were sintered in the same way as in Example 10. The resulting sinter had a density of 100% and was with $H_v$ (0.5/10) being about 230. According to the X-ray diffraction $\alpha$-$Al_2O_3$, TiAl and $TiB_2$ were observed.

The sinter had a highly controlled microstructure in which $TiB_2$ was distributed uniformly around the TiAl particles and $Al_2O_3$ whiskers were further distributed uniformly therearound.

Example 12

Aluminium particles having an average diameter ($D_M$) of 6 μm and a frequency distribution by volume of ($[D_M/5, 5D_M]$, ≧90%) had their surfaces coated with $TiB_2$ (titanium boride) and Ti (titanium) by the procedure of Example 5 to yield $TiB_2$ and Ti coated aluminum particles consisting of Al, $TiB_2$ and Ti in a ratio of 47:3:50 (vol %).

The coated aluminum particles were sintered under the same conditions as in Example 8. The resulting sinter had TiAl as a main ingredient and a density of 100%, and it was with $H_v$ (0.5/10) being 230. The sinter had a highly controlled microstructure in which $TiB_2$ was distributed uniformly around the fine TiAl particles.

Example 13

The coated TiAl particles prepared in Example 2 which were coated with titanium boride ($TiB_2$) were stamped into a disk having a diameter of 16 mm and a thickness of 10 mm. The disk was set in a hot press (HP) apparatus equipped with a graphite mold packed with a hexagonal boron nitride (h-BN) powder in the outside. After degassing to $10^{-3}$ torr at 200° C., an argon gas was admitted into the apparatus while sintering was done with the shaped part being held at a sintering temperature of 1200° C. and at a sintering pressure of 20 MPa for 3 hr. Following furnace cooling, the pressure was opened to atmosphere for recovering the sinter.

Figure 13B:
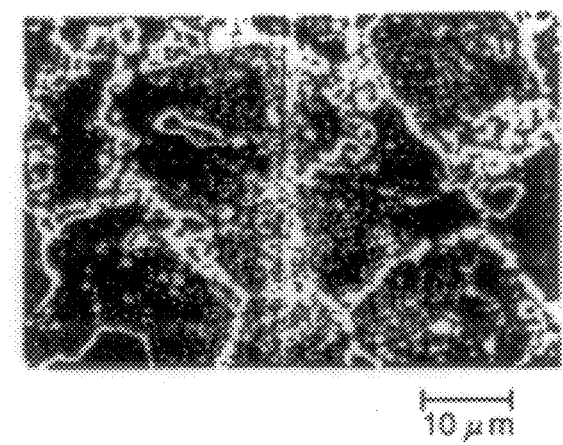

The resulting sinter was checked by X-ray diffraction and only TiAl and $TiB_2$ existed. The sinter was very dense and its relative density was at least 99% within errors of measurement; in addition, it was with the Vickers hardness being 230. The electron micrograph (×1000) of the polished surface of the sinter is shown in the FIG. 13b. From FIG. 13b one can see that the sinter was entirely free from unsintered portions, pores, defects, etc. and that it was comprised of a highly controlled microstructure in which titanium boride was distributed uniformly around the TiAl particles.

Figure 14B:
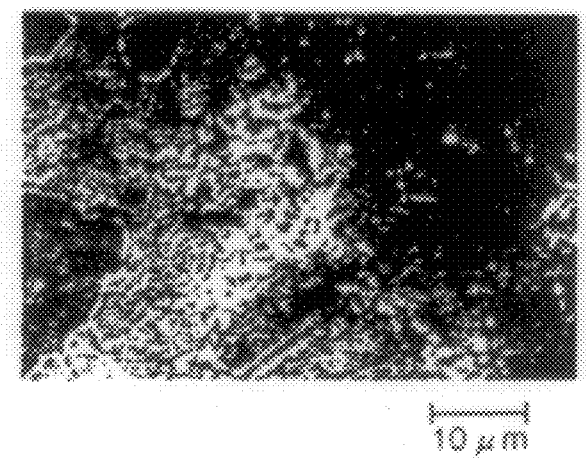

For comparison, TiAl particles of the same grade as used in Example 2 were left uncoated with titanium boride and sintered together with a corresponding amount of titanium boride fine particles under the same sintering conditions as used in Example 13. The electron micrograph (×1000) of the polished surface of the thus prepared sinter is shown in FIG. 14b. From FIG. 14b one can see that although the sintering conditions were the same, the particles grew to coarse grains, titanium boride was distributed uniformly and, in addition, many pores were observed, indicating the total failure to control the microstructure of the sinter.

Example 14

The tungsten particles prepared in Example 4 which were coated with titanium nitride were stamped into a disk having a diameter of 16 mm and a thickness of 10 mm. The disk was placed in a Pyrex glass capsule, packed with a hexagonal boron nitride (h-BN) powder in the outside, degassed at $10^{-6}$ torr and 400° C. for 12 hr. and thereafter sealed. The thus sealed capsule was set in a HIP apparatus using an argon gas as a pressure-transmitting medium and sintered by being held at a sintering temperature of 1800° C. and at a sintering pressure of 200 MPa for 3 hr. Following furnace cooling, the pressure was opened to atmosphere for recovering the sinter.

The recovered sinter was very dense and its relative density was at least 99% within errors of measurement; in addition, it was with the Vickers hardness being 700.

This sinter was entirely free from unsintered portions, pores, defects, etc. and titanium nitride was distributed uniformly around the tungsten particles; in short, the sinter had a highly controlled microstructure.

Example 15

The coated titanium particles prepared in Example 6 which were coated with aluminum were stamped into a disk having a diameter of 16 mm and a thickness of 10 mm. The disk was set in a hot press (HP) apparatus equipped with a graphite mold packed with a hexagonal boron nitride (h-BN) powder in the outside. After degassing to $10^{-3}$ torr at 200° C., an argon gas was admitted into the apparatus while sintering was done with the shaped part being held at a sintering temperature of 1200° C. and at a sintering pressure of 20 MPa for 2 hr. Following furnace cooling, the pressure was opened to atmosphere for recovering the sinter.

The recovered sinter was checked by X-ray diffraction and only TiAl existed. The sinter was very dense and its relative density was at least 99% within errors of measurement; in addition, it was with the Vickers hardness being 230.

This sinter was entirely free from unsintered portions, pores, defects, etc. and had a microstructure in which grain growth consisting of the TiAl was controlled.

Example 16

Titanium particles having an average diameter ($D_M$) of 120 μm and a frequency distribution by volume of ($[D_M/5, 5D_M]$, ≧90%) were coated with aluminum under the almost same condition as in Example 6 to yield a powder of 50% by volume aluminum coated titanium particles.

This aluminum coated titanium particles were added and mixed with alumina ($Al_2O_3$) whiskers of 15% by volume and were stamped into a disk having a diameter of 16 mm and a thickness of 10 mm. The disk was then placed in a Pyrex glass capsule packed a h-BN powder, degassed at $10^{-6}$ torr and 400° C. for 12 hr, and thereafter sealed. The thus sealed capsule was set in a HIP apparatus using an argon gas as a pressure-transmitting medium and sintered by being held at a sintering temperature of 1200° C. and at a sintering pressure of 200 MPa for 2 hr. Following furnace cooling, the pressure was opened to atmosphere for recovering the sinter.

The recovered sinter was checked by X-ray diffraction and only TiAl and alumina existed. The sinter was very dense and its relative density was at least 99% and was with Vickers microhardness being 230. The sinter was entirely free from unsintered portions, pores, defects, etc. and had a microstructure in which grain growth consisting of TiAl was controlled and the alumina whiskers were distributed uniformly.

Example 17

Titanium particles having an average diameter ($D_M$) of 120 μm and a frequency distribution by volume of ($[D_M/5, 5D_M]$, ≧90%) were coated with titanium boride ($TiB_2$) and this coated particles were further coated with aluminum by the almost same condition as in Example 6 to yield a powder of the coated titanium particles which were coated with 2.0% by mol of titanium boride and 49.0% by mol of aluminum.

The coated titanium particles were stamped into a disk having a diameter of 16 mm and a thickness of 10 mm. The disk was then placed in a Pyrex glass capsule packed a h-BN powder, degassed at $10^{-6}$ torr and 400° C. for 12 hr, and thereafter sealed. The thus sealed capsule was set in a HIP apparatus using an argon gas as a pressure-transmitting medium and sintered by being held at a sintering temperature of 1200 ° C. and at a sintering pressure of 200 MPa for 2 hr. Following furnace cooling, the pressure was opened to atmosphere for recovering the sinter.

The recovered sinter was checked by X-ray diffraction and only TiAl and $TiB_2$ existed. The sinter was very dense and its relative density was at least 99% and was with Vickers microhardness being 230. The sinter was entirely free from unsintered portions, pores, defects, etc. and had a controlled microstructure in which titanium boride was distributed uniformly around the TiAl particles.

Example 18

TiAl particles having an average diameter ($D_M$) of 40 μm and a frequency distribution by volume of ($[D_M/5, 5D_M]$, ≧90%) were coated with alumina (Al2O3) by the almost same condition as in Example 2 to yield a powder of 5% by volume alumina coated TiAl particles.

The alumina coated TiAl particles were stamped into a disk having a diameter of 16 mm and a thickness of 5 mm. The disk was set in a hot press (HP) apparatus equipped with a graphite mold packed with a hexagonal boron nitride (h-BN) powder in the outside. After degassing to $10^{-3}$ torr at 200° C., an argon gas was admitted into the apparatus while sintering was done with the shamed part being held at a sintering temperature of 1200° C. and at a sintering pressure of 200 MPa for 2 hr. Following furnace cooling, the pressure was opened to atmosphere for recovering the sinter.

The recovered sinter was checked by X-ray diffraction and only TiAl and α-alumina existed. The sinter was very dense and its relative density was at least 99% within errors of measurement; in addition, it was with the Vickers hardness being 230.

The sinter was entirely free from unsintered portions, pores, defects, etc. and had a highly controlled microstructure in which alumina was distributed uniformly around the TiAl particles.

Example 19

TiAl particles having an average diameter ($D_M$) of 40 μm and a frequency distribution by volume of ($[D_M/5, 5D_M]$, ≧90%) were coated with titanium boride ($TiB_2$) by the almost same condition as in Example 2 to yield a powder of the coated zirconium boride particles which were coated with 5% by volume of titanium boride.

This titanium boride coated TiAl particles were added and mixed with alumina whiskers of 15% by volume and were stamped into a disk having a diameter of 16 mm and a thickness of 10 mm. The disk was set in a hot press (HP) apparatus equipped with a graphite mold packed with a hexagonal boron nitride (h-BN) powder in the outside. After degassing to $10^{-3}$ torr at 200° C., an argon gas was admitted into the apparatus while sintering was done with the shaped part being held at a sintering temperature of 1200° C. and at a sintering pressure of 20 MPa for 2 hr. Following furnace cooling, the pressure was opened to atmosphere for recovering the sinter.

The sinter was very dense and its relative density was at least 99% within errors of measurement; in addition, it was with the Vickers hardness being 230.

The sinter was entirely free from unsintered portions, pores, defects, etc. and had a highly controlled microstructure in which titanium boride and alumina whiskers were distributed uniformly around the TiAl particles.

Example 20

Nickel particles having an average diameter ($D_M$) of 20 μm and a frequency distribution by volume of ([$D_M/5, 5D_M$], ≧90%) were coated with aluminum by the almost same condition as in Example 4 to yield a powder of the coated nickel particles which were coated with 50% by mol of aluminum.

This aluminum coated nickel particles were stamped into a disk having a diameter of 16 mm and a thickness of 10 mm. The disk was then placed in a Pyrex glass capsule packed a h-BN powder, degassed at $10^{-6}$ torr and 400° C. for 12 hr, and fused. The thus sealed capsule was set in a HIP apparatus using an argon gas as a pressure-transmitting medium and sintered by being held at a sintering temperature of 1200 ° C. and at a sintering pressure of 200 MPa for 2 hr. Following furnace cooling, the pressure was opened to atmosphere for recovering the sinter.

The recovered sinter was checked by X-ray diffraction and only NiAl existed. The sinter was very dense and its relative density was at least 99% and was with Vickers hardness being 700. The sinter was entirely free from unsintered portions, pores, defects, etc. and had a microstructure in which grain growth was controlled.

Example 21

Nickel particles having an average diameter ($D_M$) of 20 μm and a frequency distribution by volume of ([$D_M/5, 5D_M$], ≧90%) were coated with aluminum by the almost same condition as in Example 4 to yield a powder of the coated nickel particles which were coated with 25% by mol of aluminum and this coated nickel particles were further coated with 5% by volume of alumina ($Al_2O_3$) by the almost same condition as in Example 4 to yield composite coated nickel particles.

This composite coated nickel particles were stamped into a disk having a diameter of 16 mm and a thickness of 5 mm. The disk was then placed in a Pyrex glass capsule packed a h-BN powder, degassed at $10^{-6}$ torr and 400° C. for 12 hr, and fused. The thus sealed capsule was set in a HIP apparatus using an argon gas as a pressure-transmitting medium and sintered by being held at a sintering temperature of 1200 ° C. and at a sintering pressure of 200 MPa for 2 hr. Following furnace cooling, the pressure was opened to atmosphere for recovering the sinter.

The recovered sinter was checked by X-ray diffraction and only $Ni_3Al$ and α-alumina existed. The sinter was very dense and its relative density was at least 99% within errors of measurement; in addition, it was with the Vickers hardness being 750.

The sinter was entirely free from unsintered portions, pores, defects, etc. and had a highly controlled microstructure in which alumina was distributed uniformly around the $Ni_3Al$ particles.

What is claimed is:

1. A process for producing a metal-base sinter comprising the steps of:

(A) a dispersing step for dispersing a powder of metal core particles by a multiplicity of means for dispersion treatment of particles in a gaseous atmosphere to form a mixture of a gas and dispersed metal core particles, and charging into a coating space the powder of the metal core particles dispersed at a predetermined dispersity in accordance with an average diameter frequency distribution by volume, wherein said multiplicity of means for dispersion treatment of particles comprises at least one dispersing means for dispersing the metal core particles in the gaseous atmosphere and a final treating means, and wherein said final treating means is selected from between:

(a) final dispersing means positioned most downstream among said multiplicity of means for dispersion treatment of particles and said at least one dispersing means; and (b) means for forming the mixture of the gas and the particles in the powder of dispersed particles at the predetermined dispersity which comprises;

(b-1) means for selecting a mixture of the gas and the particles in the powder of dispersed particles at the predetermined dispersity that separates a portion of the powder that is composed of particles dispersed at a dispersity less than said predetermined dispersity from the mixture of the gas and the particles in the powder of core particles in which the particles in the powder of core particles are dispersed in the gaseous atmosphere, thereby selecting the mixture of the gas and the particles in the powder of dispersed core particles in which the particle in the powder of core particles are dispersed at a dispersity not less than said predetermined dispersity and present in the gaseous atmosphere mainly in a single-particle state; and (b-2) feedback means by which the portion of the powder that is composed of particles dispersed at the dispersity less than the predetermined dispersity and which has been separated by said means for selecting the mixture of the gas and the particles in the powder of dispersed particles at the predetermined dispersity is transported to the final dispersing means and/or treating means upstream of the final dispersing means; and (B) a coating step for allowing the particles in the powder of metal core particles that have been dispersed at the predetermined dispersity in the dispersing step (A) to contact and/or impinge against a precursor of a coat forming substance in a coating start region of the coating space as said particles are dispersed at the predetermined dispersity to satisfy preset conditions so that said particles are coated with the coat forming substance to produce coated metal particles, wherein said preset conditions are the following conditions:

the dispersity β should be at least 70% if those particles have an average diameter of no more than 10 μm in the frequency distribution by volume;

the dispersity β should be at least 80% if those particles have an average diameter in excess of 10 μm but no more than 20 μm in the frequency distribution by volume;

the dispersity p should be at least 90% if those particles have an average diameter in excess of 20 μm but no more than 50 μm in the frequency distribution by volume;

the dispersity β should be at least 95% if those particles have an average diameter in excess of 50 μm but no more than 300 μm in the frequency distribution by volume;

the dispersity β should be at least 97% if those particles have an average diameter in excess of 300 μm but no more than 800 μm in the frequency distribution by volume; and the dispersity β should be at least 99% if those particles have an average diameter in excess of 800 μm in the frequency distribution by volume;

(C) shaping step for shaping the coated particles produced in the coating step (B) or a mixture thereof into a shaped body of desired configuration; and (D) sintering the shaped body produced in the shaping step (C) at a predetermined pressure and temperature to produce the metal-base sinter.

2. A process for producing a metal-base sinter according to claim 1 wherein said coated metal particles are prepared through the following additional step(s):

a step of disagglomeration or size reduction in which lumps of the coated metal particles that form as a result of agglomeration of several particles that contact one another via the coat forming substance on the coated particles are disagglomerated and/or reduced in size; and/or a step of selective separation in which the agglomerating lumps of the coated metal particles are separated from the non-agglomerating coated metal particles.

3. The process for producing a metal-base sinter according to claim 1, wherein the dispersing step is performed by:

a multiplicity of means for dispersion treatment of particles that has such dispersing performance that a powder of core particles having an average diameter of no more than 10 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 70%;

a multiplicity of means for dispersion treatment of particles that has such dispersing performance that a powder of core particles having an average diameter in excess of 10 μm but no more than 20 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 80%;

a multiplicity of means for dispersion treatment of particles that has such dispersing performance that a powder of core particles having an average diameter in excess of 20 μm but no more than 50 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 90%;

a multiplicity of means for dispersion treatment of particles that has such dispersing performance that a powder of core particles having an average diameter in excess of 50 μm but no more than 300 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 95%;

a multiplicity of means for dispersion treatment of particles that has such dispersing forth above, and means for separating a mixture of a gas and the particles in a powder of core particles dispersed at a dispersity less than one of the dispersities set forth above from said gas-particle mixture so as to select a mixture of a gas and the particles in a powder of dispersed core particles in which the core particles are present in the gaseous atmosphere mainly in a single-particle state.

4. A process for producing a metal-base sinter according to claim 1, wherein the dispersing step is performed by:

a multiplicity of means for dispersion treatment of particles that has such dispersing performance that a powder of core particles having an average diameter of no more than 10 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 70%;

a multiplicity of means for dispersion treatment of particles that has such dispersing performance that a powder of core particles having an average diameter in excess of 10 μm but no more than 20 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 80%;

a multiplicity of means for dispersion treatment of particles that has such dispersing performance that a powder of core particles having an average diameter in excess of 20 μm but no more than 50 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 90%;

a multiplicity of means for dispersion treatment of particles that has such dispersing performance that a powder of core particles having an average diameter in excess of 300 μm but no more than 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 97%; and a multiplicity of means for dispersion treatment of particles that has such dispersing performance that a powder of core particles having an average diameter in excess of 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 99%; and said coated metal particles being prepared by:

a method in which the mixture of a gas and the particles in the powder of dispersed core particles as formed by one of the means in said multiplicity of means for dispersion treatment of particles is either discharged directly to the coating step or transported thereto via at least one member selected from the group consisting of a hollow member an intermediate member composed of a member that forms a hollow portion, and a pipe and which is provided between the dispersing and coating steps, as the mixture emerges from a discharge section that discharges said mixture of a gas and the particles; and/or a method in which the mixture of a gas and the particles in the powder of dispersed core particles as formed by one of the means in said multiplicity of means for dispersion treatment of particles is transported to the coating step via at least one means selected from the group consisting of means for maintaining the dispersion in a gaseous atmosphere of the dispersed core particles in the mixture of a gas with the core particles which have been dispersed in the gaseous atmosphere to attain one of the dispersities set forth above, means for enhancing the dispersion in a gaseous atmosphere of the dispersed core particles in the mixture of a gas with the core particles which have been dispersed in the gaseous atmosphere to attain one of the dispersities Set performance that a powder of core particles having an average diameter in excess of 50 μm but no more than 300 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 95%;

a multiplicity of means for dispersion treatment of particles that has such dispersing performance that a powder of core particles having an average diameter in excess of 300 μm but no more than 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 97%; and a multiplicity of means for dispersion treatment of particles that has such dispersing performance that a powder of core particles having an average diameter in excess of 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 99%;

wherein a part of the dispersing step occurs in the same space as a part of the coating step.

5. A process for producing a metal-base sinter according to claim 1, wherein said coated metal particles are or are further prepared such that the coating start region of the coating space is located in a space region that include planes through which all particles in the powder of dispersed core particles as mixed with gas will pass, said space region selected from the group consisting of:

a space region in which a powder of core particles that have an average diameter of no more than 10 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 99%, or wherein said coated metal particles are prepared with the coating start region of the coating space being located in either one of the following space regions that includes planes through which all particles to be recovered into the recovery section of the recovery means will pass:

a space region in which a powder of core particles that have an average diameter of no more than 10 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 70%;

a space region in which a powder of core particles that have an average diameter in excess of 10 μm but no more than 20 μm in the frequency distribution by volume is dispersed in a gaseous atmosphere by the final treatment by said multiplicity of means for dispersion treatment of particles, thereby forming a mixture of a gas and the particles in the powder of dispersed core particles and that the dispersity β of the particles in said powder of core particles is adjusted to at least 80%;

a space region in which a powder of core particles that have an average diameter in excess of 20 μm but no more than 50 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 90%;

a space region in which a powder of core particles that have an average diameter in excess of 50 μm but no more than 300 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 95%;

a space region in which a powder of core particles that have an average diameter in excess of 300 μm but no more than 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 97%; and a space region in which a powder of core particles that have an average diameter in excess of 800 μm in the frequency distribution by volume is dispersed in a gaseous atmosphere by the final treatment by the multiplicity of means for dispersion treatment of particles, thereby forming a mixture of a gas and the particles in the powder of dispersed core particles and that the dispersity β of the particles in said powder of core particles is adjusted to at least 99%.

6. A process for producing a metal-base sinter according to claim 1 wherein the particles in the powder of core particles to be used have a size distribution of $\{D_M/5, 5D_M\}$, ≧90% in terms of frequency distribution by volume, where $D_M$ represents the average particle diameter.

7. The process for producing a metal-base sinter according to claim 1, wherein said precursor of the coat forming substance is generated via the vapor phase and/or said precursor of a coat forming substance is in a vapor-phase state.

8. The process for producing a metal-base sinter according to claim 1, wherein said metal core particles are provided with coats of said coat forming substances in a form of ultrafine particles.

9. The process for producing a metal-base sinter according to claim 8, wherein said coat forming substance in the form of ultrafine particle provides a coating of uniform distribution.

10. The process for producing a metal-base sinter according to claim 8, wherein a diameter of the ultrafine particle ranges from 0.005 μm to 0.5 μm.

11. The process for producing a metal-base sinter according to claim 1, wherein said metal core particles are provided with a uniform coating of the coat forming substance.

12. The process for producing a metal-base sinter according to claim 1, wherein the shaping step (C) is performed by at least one selected from among injection molding, stamping and slip casting.

13. The process for producing a metal-base sinter according to claim 1, wherein the sintering step (D) is performed by at least one selected from among hot press and hot isostatic press.

14. A metal-base sinter that is produced by the process for producing a metal-base sinter as recited in claim 1.

15. A metal-base sinter that is produced by the process for producing a metal-base sinter as recited in claim 2.

16. A metal-base sinter that is produced by the process for producing a metal-base sinter as recited in claim 3.

17. A metal-base sinter that is produced by the process for producing a metal-base sinter as recited in claim 4.

18. A metal-base sinter that is produced by the process for producing a metal-base sinter as recited in claim 5.

19. A metal-base sinter that is produced by the process for producing a metal-base sinter as recited in claim 6.

20. A process for producing a metal-base sinter, comprising the steps of:

dispersing a powder of metal core particles in a gaseous atmosphere to form a mixture of a gas and particles in a powder of highly dispersed core particles in such a way that a dispersity β of the metal core particles in the mixture is adjusted to predetermined value depending upon an average diameter of the metal core particles in a coating start region of a coating space;

starting to coat the particles in the powder of highly dispersed core particles with a coat forming substances by permitting a precursor of the coat forming substance to contact and/or impinge against the particles in said mixture of gas and powder of highly dispersed core particles in the coating start region of the coating space as the dispersity β should be either one of:

at least 70% if those particles have an average diameter of no more than 10 μm in the frequency distribution by volume;

at least 80% if those particles have an average diameter in excess of 10 μm but no more than 20 μm in the frequency distribution by volume;

at least 90% if those particles have an average diameter in excess of 20 μm but no more than 50 μm in the frequency distribution by volume;

at least 95% if those particles have an average diameter in excess of 50 μm but no more than 300 μm in the frequency distribution by volume;

at least 97% if those particles have an average diameter in excess of 300 μm but no more than 800 μm in the frequency distribution by volume; and at least 99% if those particles have an average diameter in excess of 800 μm in the frequency distribution by volume; then coating surface of the particles in said powder of highly dispersed core particles with the coat forming substance by allowing to continue contacting and/or impinging the particles in said powder of highly dispersed core particles against the precursor of the coat forming substance to obtain coated metal particles; and sintering the coated metal particles or mixture containing such particles.

21. A process for producing a metal-base sinter according to claim 20 wherein said dispersing step comprises:

a) dispersing a powder of less highly dispersed core particles including agglomerated particles, as well as said powder of metal core particles in the gaseous atmosphere;

b) separating the particles in the powder of less highly dispersed core particles from the particles in the powder of high dispersed core particles, wherein the particles in the powder of highly dispersed core particles are substantially single particles in the gaseous atmosphere;

c) transporting the particles in the powder of less highly dispersed core particles to the step a); and d) repeating steps a), b) and c) on the powder of less highly dispersed core particles to form said mixture of the gas and the particles in the powder of highly dispersed core particles.

22. A process for producing a metal-base shaped body of sintered particles comprising the steps of generating a downwardly directed plasma flame of a gas entraining a powder of a coat-forming solid substance for a duration effective to vaporize the coat-forming substance, thereby forming a downwardly flowing, coating precursor vapor, injecting dispersing gas-entrained metal particles in a substantially lateral direction into a contact zone in the path of the coating precursor vapor while maintaining the dispersing gas-entrained metal particles in the contact zone at a predetermined dispersity β selected according to a predefined relationship between dispersity β and volume average diameter of the dispersing gas-entrained metal particles, contacting the coating precursor vapor with the metal particles through a cooling zone, thereby solidifying the coating, collecting the metal particles, shaping the thus collected coated metal particles or a mixture containing them into a shaped body of desired configuration, and sintering the shaped body at a predetermined pressure and temperature to produce the shaped body of metal-base sintered particles, and collecting same.

23. The process of claim 22 in which the metal particles define a volume average diameter and the metal particles of diameter in the range of about 0.2–5 times the volume average diameter account for at least 90% of the total volume of the metal particles.

24. The process of claim 23 in which the dispersity β in the contact zone is (1) at least 70% if the dispersing gas-entrained metal particles have an average volume diameter of at most 10 μm, (2) at least 80% if the dispersing gas-entrained metal particles have an average volume diameter greater than 10 μm and at most 20 μm, (3) at least 90% if the dispersing gas-entrained metal particles have an average volume diameter greater than 20 μm and at most 50 μm, (4) at least 95% if the dispersing gas-entrained metal particles have an average volume diameter greater than 50 μm and at most 300 μm, (5) at least 97% if the dispersing gas-entrained metal particles have an average volume diameter greater than 300 μm and at most 800 μm, and (6) at least 99% if the dispersing gas-entrained metal particles have an average volume diameter greater than 800 μm.

25. The process of claim 22 in which the entraining of metal particles comprises dispersing the particles with an agitating disperser, and a capillary disperser.

26. The process of claim 25 in which the agitating disperser, and capillary disperser are in a series in which the capillary disperser follows the agitating disperser.

27. The process of claim 22 in which the injecting step further comprises impinging the dispersing gas-entrained metal particles against a vertical impingement plate in the contact zone thereby dispersing the gas-entrained metal particles to the predetermined dispersity β.

28. The process of clam 22 in which the entraining step comprises the steps of feeding the dispersing gas-entrained metal particles to a cyclone separator means, separating the dispersing gas-entrained metal particles into (a) a fraction of highly dispersed particles to a dispersity β greater than the predetermined dispersity β and into (b) a fraction of less dispersed particles dispersed to a dispersity β of less than the predetermined dispersity β, processing the fraction of less dispersed particles in an agitating disperser means, thereby forming a fraction of particles dispersed to a dispersity greater than the predetermined dispersity β, feeding that fraction of increased dispersity to the cyclone separator means, and admitting the highly dispersed particles from the cyclone separator means to the injecting step, whereby the highly dispersed particles are processed to coating, sintering and collection of coated sintered particles.

29. The process of claim 22 in which the shaping step is performed by at least one selected from among injection molding, stamping and slip casting.

30. The process of claim 22 in which the sintering step is performed by at least one selected from among hot press and hot isostatic press.

31. The process of claim 24 in which the shaping step is performed by at least one selected from among injection molding, stamping and slip casting.

32. The process of claim 31 wherein the particles are dispersed to a dispersity greater than 70%.

33. The process of claim 32 wherein the contacting of particles with the precursor vapor occurs at a time when the vapor is changing from the gaseous state to a liquid or solid state.

34. The process of claim 22 wherein the particles are dispersed to a dispersity greater than 70%.

35. The process of claim 24 in which the metal particles of the smallest average volume diameter are coated and sintered, and the particles of a larger average volume diameter are processed to a higher degree of dispersity.

* * * * *